(12) United States Patent
Yoon et al.

(10) Patent No.: US 10,903,235 B2
(45) Date of Patent: Jan. 26, 2021

(54) NON-VOLATILE MEMORY DEVICE AND OPERATION METHOD THEREOF

(71) Applicant: Samsung Electronics Co., Ltd., Suwon-si (KR)

(72) Inventors: Jungho Yoon, Yongin-si (KR); Soichiro Mizusaki, Suwon-si (KR); Youngjin Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/662,299

(22) Filed: Oct. 24, 2019

(65) Prior Publication Data

US 2020/0161328 A1    May 21, 2020

(30) Foreign Application Priority Data

Nov. 15, 2018   (KR) .................. 10-2018-0141138

(51) Int. Cl.
| | |
|---|---|
| *H01L 27/11* | (2006.01) |
| *H01L 27/11582* | (2017.01) |
| *H01L 27/1157* | (2017.01) |
| *H01L 27/11556* | (2017.01) |
| *H01L 21/762* | (2006.01) |

(52) U.S. Cl.
CPC .. *H01L 27/11582* (2013.01); *H01L 21/76229* (2013.01); *H01L 27/1157* (2013.01); *H01L 27/11556* (2013.01)

(58) Field of Classification Search
CPC .............. G11C 14/0045; G11C 14/009; G11C 14/0036; G11C 14/0081
See application file for complete search history.

(56) References Cited

U.S. PATENT DOCUMENTS

| | | |
|---|---|---|
| 8,427,865 B2 | 4/2013 | Shima et al. |
| 9,093,369 B2 | 7/2015 | Shin et al. |
| 9,343,144 B2 | 5/2016 | Murooka |
| 9,947,685 B2 | 4/2018 | Fujii et al. |
| 9,947,686 B2 | 4/2018 | Son et al. |
| 2008/0239799 A1 | 10/2008 | Watanabe |

(Continued)

OTHER PUBLICATIONS

Xia, Qiangfei et al., "Two- and Three-Terminal Resistive Switches: Nanometer-Scale Memristors and Memistors", Advanced Functional Materials, May 19, 2011, pp. 2660-2665, 2011 WILEY-VCH Verlag GmbH & Co. KGaA, Weinheim.

(Continued)

*Primary Examiner* — Han Yang
(74) *Attorney, Agent, or Firm* — Harness, Dickey & Pierce, P.L.C.

(57) ABSTRACT

Provided is a non-volatile memory device including a control logic, a semiconductor layer, a resistance switching layer, a gate oxide layer, and a gate stack including a plurality of gates and a plurality of insulating layers, wherein the plurality of gates and the plurality of insulating layers are stacked alternately with each other. The resistance switching layer is provided between the semiconductor layer and the gate stack. The gate oxide layer is provided between the resistance switching layer and the gate stack. A cell string including a plurality of memory cells is formed by the gate stack, the resistance switching layer, and the gate oxide layer.

20 Claims, 18 Drawing Sheets

(56) References Cited

U.S. PATENT DOCUMENTS

| | | | |
|---|---|---|---|
| 2013/0328005 A1* | 12/2013 | Shin | H01L 27/2436 |
| | | | 257/1 |
| 2014/0085961 A1 | 3/2014 | Kanamori et al. | |
| 2014/0160837 A1 | 6/2014 | Ahn | |
| 2014/0246646 A1* | 9/2014 | Sasago | H01L 27/2481 |
| | | | 257/5 |
| 2016/0064454 A1 | 3/2016 | Park | |
| 2017/0092355 A1 | 3/2017 | Kurotsuchi et al. | |

OTHER PUBLICATIONS

Wang, Qi et al., "Nonvolatile three-terminal operation based on oxygen vacancy drift in a Pt/Ta2O5-x/Pt,Pt structure", Applied Physics Letters 102, 233508, Jun. 13, 2013, AIP Publishing LLC.

* cited by examiner

NON-VOLATILE MEMORY DEVICE AND OPERATION METHOD THEREOF

CROSS-REFERENCE TO RELATED APPLICATION

This application claims the benefit of Korean Patent Application No. 10-2018-0141138, filed on Nov. 15, 2018 in the Korean Intellectual Property Office, the disclosure of which is incorporated herein in its entirety by reference.

BACKGROUND

1. Field

The present disclosure relates to non-volatile memory devices and methods of operating non-volatile memory devices.

2. Description of the Related Art

A non-volatile memory device is a semiconductor memory device that includes a plurality of memory cells that retain information even when the supply of power thereto is turned off such that the retained information may be used when the supply of power is turned on. As an example, non-volatile memory devices may be used in cellular phones, digital cameras, portable information terminals such as personal digital assistants (PDAs), mobile computer devices, stationary computer devices, and other devices.

Recently, research has been conducted to use a three-dimensional (3D) (or vertical) NAND (VNAND) in a chip of a next-generation neuromorphic computing platform or neural network.

In particular, a technique to develop memory cells characterized by high-integration, low-power consumption, and possibility of using them in random access memory devices is desirable.

SUMMARY

Provided are non-volatile memory devices and methods of operating non-volatile memory devices.

Additional aspects will be set forth in part in the description which follows and, in part, will be apparent from the description, or may be learned by practice of some example embodiments presented herein.

According to an aspect of some example embodiments, there is provided a non-volatile memory device including a control logic, a semiconductor layer extending in a first direction, a gate stack including a plurality of gates and a plurality of insulating layers, both extending in a second direction different than the first direction, wherein the plurality of gates and the plurality of insulating layers are stacked alternately with each other, a resistance switching layer extending in the first direction between the gate stack and the semiconductor layer, and a gate oxide layer extending in the first direction between the gate stack and the resistance switching layer, in which a cell string is formed by the gate stack, the resistance switching layer, and the gate oxide layer.

The cell string may include a selected memory cell and a non-selected memory cell, and the control logic may be configured to perform a program operation with respect to the selected memory cell by applying a first positive voltage to a string selection line connected to the selected memory cell, grounding a bit line connected to the selected memory cell, apply a second positive voltage that is greater than the first positive voltage to a word line connected to the selected memory cell, and applying the first positive voltage to a word line connected to the non-selected memory cell.

The cell string may include a selected memory cell and a non-selected memory cell, and the control logic may be configured to perform an erase operation with respect to the selected memory cell by applying a first positive voltage to a string selection line connected to the selected memory cell, grounding a bit line connected to the selected memory cell, applying a negative voltage having an absolute value that is greater than an absolute value of the first positive voltage to a word line connected to the selected memory cell, and applying the first positive voltage to a word line connected to the non-selected memory cell.

The control logic may be further configured to, based on the bit line connected to the selected memory cell being grounded, cause the first positive voltage to be applied to the word line connected to the non-selected memory cell, cause the second positive voltage to be applied to the word line connected to the selected memory cell, and cause a ground channel to be formed in the semiconductor layer, and the memory cell may be further configured such that, based on a voltage difference between a gate corresponding to the selected memory cell and the ground channel based on the second positive voltage to the word line connected to the selected memory cell, oxygen vacancies in the selected memory cell may move toward the semiconductor layer such that the program operation with respect to the selected memory cell is performed.

The control logic may be further configured to, based on the bit line connected to the selected memory cell being grounded, cause the first positive voltage to be applied to the word line connected to the non-selected memory cell, cause the negative voltage to be applied to the word line connected to the selected memory cell, and cause a ground channel to be formed in the semiconductor layer due to a fringing field effect caused by the non-selected memory cell located adjacent to the selected memory cell, and the memory cell may be further configured such that, based on a voltage difference between a gate corresponding to the selected memory cell and the ground channel based on of the negative voltage to the word line connected to the selected memory cell, oxygen vacancies in the selected memory cell may move in a direction opposite to the semiconductor layer such that the erase operation with respect to the selected memory cell is performed.

The cell string may include a selected memory cell and a non-selected memory cell, and the control logic may be configured to perform a read operation with respect to the selected memory cell by applying a first positive voltage to a string selection line connected to the selected memory cell, applying a read voltage to a bit line connected to the selected memory cell, applying a voltage having an absolute value that is less than an absolute value of the first positive voltage to a word line connected to the selected memory cell, and applying the first positive voltage to a word line connected to the non-selected memory cell.

A resistance state of the selected memory cell may be based on positions of the oxygen vacancies in the selected memory cell, and the control logic may be further configured to apply the read voltage to the bit line connected to the selected memory cell and read data based on a read current that is determined by the resistance state of the selected memory cell.

The selected memory cell may be configured to enter a low resistance state as the oxygen vacancies in the selected memory cell move towards the semiconductor layer based on the program operation being performed with respect to the selected memory cell, and the selected memory cell may be configured to enter a high resistance state as the oxygen vacancies in the selected memory cell move in a direction opposite to the semiconductor layer based on the erase operation being performed with respect to the selected memory cell.

A word plane may include a plurality of selected memory cells connected to a word line, and the control logic may be configured to perform the erase operation with respect to the plurality of selected memory cells by applying a first positive voltage to a plurality of string selection lines connected to the plurality of selected memory cell, grounding a bit line connected to the plurality of selected memory cells, applying a negative voltage having an absolute value that is greater than an absolute value of the first positive voltage to the connected word line, and applying the first positive voltage to a word line other than the connected word line.

The gate, the semiconductor, and the gate oxide layer may form a transistor, and based on the control logic performing the read operation, a memory cell included in the cell string may correspond to a circuit in which the transistor and a resistor corresponding to the resistor switching layer are connected in parallel.

The cell string may include the selected memory cell and the non-selected memory cell, and the control logic may be further configured to, based on the control logic performing the read operation, cause a transistor corresponding to the selected memory cell to be turned off based on a voltage to the word line connected to the selected memory cell, and cause a transistor corresponding to the non-selected memory cell to be turned on based on the second positive voltage having an absolute value that is greater than an absolute value of the voltage to a word line connected to the non-selected memory cell. In some example embodiments, the voltage applied to the word line may be a desired, designed, and/or selected voltage.

The cell string may include a plurality of memory cells, and the control logic may be further configured to perform the program operation or the erase operation by grounding the bit line connected to the plurality of memory cells, causing the transistor to be turned on based on a positive voltage to the word line connected to the plurality of memory cells, causing the ground channel to be formed in the semiconductor layer, and causing the plurality of memory cells may correspond to a circuit in which a resistor corresponding to the resistance switching layer and the ground channel to be connected in series.

The control logic may be further configured to apply a positive voltage that is less than the second positive voltage to a bit line other than the bit line connected to the selected memory cell.

The control logic may be further configured to apply a negative voltage that is less than the negative voltage to a bit line other than the bit line connected to the selected memory cell.

The control logic may be further configured to ground or float a bit line other than the bit line connected to the selected memory cell.

A resistance of the selected memory cell in the low resistance state may be greater than a resistance of the ground channel formed in the semiconductor layer.

The resistance switching layer may include a transition metal oxide or nitride.

The selected memory cell may have an ohmic conductive property in the low resistance state.

According to another aspect of some example embodiments, there is provided a method of manufacturing a non-volatile memory device, the method including providing a substrate, forming a gate stack by alternately stacking a plurality of gates and a plurality of insulating layers on the substrate in a repeated manner, forming a pillar that exposes the substrate, by etching the gate stack, conformally depositing a gate oxide layer on the pillar, conformally depositing a resistance switching layer on the gate oxide layer, conformally depositing a semiconductor layer on the resistance switching layer, and filling an insulator in the semiconductor layer.

The resistance switching layer may be deposited on the gate oxide layer by using atomic layer deposition (ALD) or chemical vapor deposition (CVD).

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
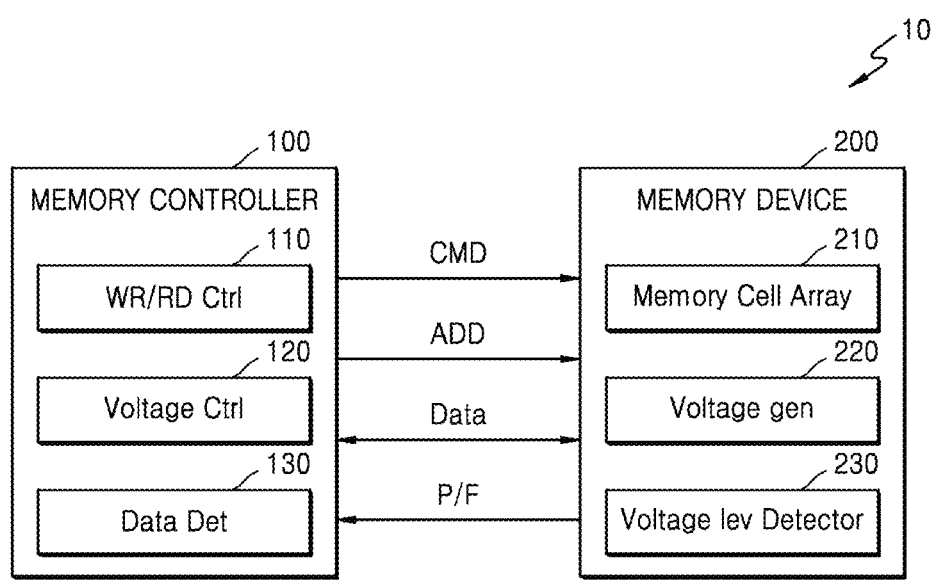
FIG. 1 is a block diagram of a memory system according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, some example embodiments are described below by referring to the figures to explain some aspects. As used herein, the term "and/or" includes any and all combinations of one or more of the associated listed items. Expressions such as "at least one of," when preceding a list of elements, modify the entire list of elements and do not modify the individual elements of the list.

The phrase "some example embodiments" does not indicate the same example embodiments. Rather, a first subset of example embodiments may differ from a second subset of example embodiments in some respects and may be similar to the second subset of example embodiments in other respects.

Some example embodiments of the present disclosure may be represented by block components and various process operations. All or some of such functional blocks may be implemented by various numbers of hardware and/or software components which perform specific functions. For example, functional blocks of the present disclosure may be implemented with one or more microprocessors or circuit elements for a specific function. The functional blocks of the present disclosure may also be implemented with various programming or scripting languages. Functional blocks may be implemented as an algorithm executed in one or more processors. Furthermore, the present disclosure may employ any number of related techniques for electronics configuration, signal processing and/or control, data processing and the like. The term "mechanism", "element", "means", or "component" is used broadly and is not limited to mechanical or physical embodiments.

Connecting lines or connecting members between elements shown in the drawings are intended to illustrate functional connections and/or physical or circuit connections. In an actual device, connections between elements may be indicated by replaceable or added various functional connections, physical connections, or circuit connections.

Hereinafter, the present disclosure will be described with reference to the accompanying drawings.

FIG. 1 is a block diagram of a memory system according to some example embodiments.

Referring to FIG. 1A, a memory system 10 may include a memory controller 100 and a memory device 200. The memory controller 100 performs a control operation with respect to the memory device 200, and for example, may perform program (or write), read, and erase operations with respect to the memory device 200 by providing an address ADD and a command CMD to the memory device 200. Data for the program operation and read data may be transmitted and received between the memory controller 100 and the memory device 200.

The memory device 200 may include a memory cell array 210 and a voltage generator 220. The memory cell array 210 may include a plurality of memory cells arranged in regions where a plurality of word lines and a plurality of bit lines intersect each other. The memory cell array 210 may include non-volatile memory cells that store data in a non-volatile way and may include, as the non-volatile memory cells, flash memory cells such as a NAND flash memory cell array, a NOR flash memory cell array, etc. Hereinbelow, a detailed description will be made of embodiments of the disclosure assuming that the memory cell array 210 includes a flash memory cell array and thus the memory device 200 is a non-volatile memory device.

The memory controller 100 may include a write/read controller 110, a voltage controller 120, and a data determiner 130.

The write/read controller 110 may generate an address ADD and a command CMD for performing program/read and erase operations with respect to the memory cell array 210. The voltage controller 120 may generate a voltage control signal for controlling at least one voltage level used in the memory device 200. For example, the voltage controller 120 may generate a voltage control signal for controlling a voltage level of a word line to read data from the memory cell array 210 or program data in the memory cell array 210.

The data determiner 130 may perform a determination operation with respect to the data read from the memory device 200. For example, by determining data read from memory cells connected to one or more word lines, the number of on-cells and/or off-cells among the memory cells may be determined. As an example, based on a program operation being performed with respect to memory cells connected to one word line, a state of data of the memory cells is determined using a read voltage, thus determining whether a program operation is normally completed with respect to all cells.

The memory device 200 may include the memory cell array 210, the voltage generator 220, and a voltage level detector 230. As stated above, the memory cell array 210 may include non-volatile memory cells, for example, flash memory cells. The flash memory cells may be implemented in various forms, and the memory cell array 210 may include, for example, three-dimensional (3D) (or vertical) NAND (VNAND) memory cells.

Figure 2:
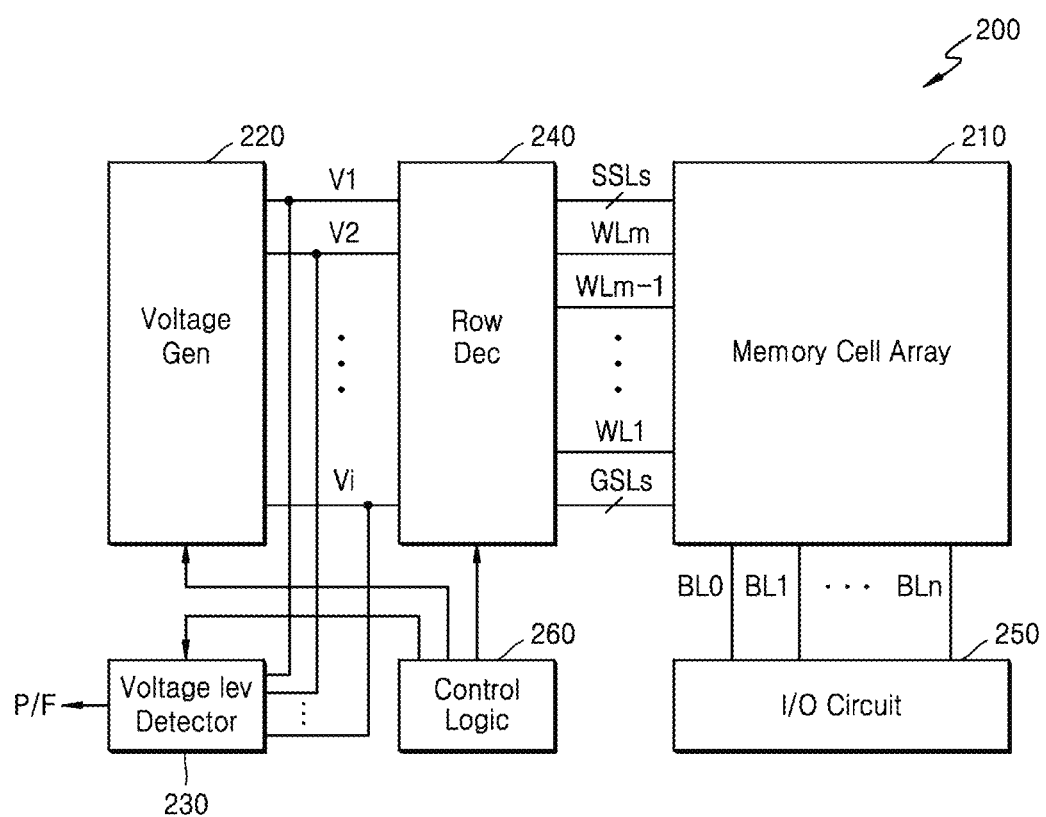
FIG. 2 is a block diagram of an example of a memory device illustrated in FIG. 1.

FIG. 2 is a block diagram of an example of a memory device illustrated in FIG. 1.

As illustrated in FIG. 2, the memory device 200 may include the memory cell array 210, the voltage generator 220, and the voltage level detector 230. The memory device 200 may further include a row decoder 240, an input/output circuit 250, and a control logic 260. In some example embodiments, the voltage generator 220, the voltage level detector 230, the row decoder 240, and/or the control logic 260 may include processing circuitry. In some example embodiments, the processing circuitry may include hardware such as logic circuits; a hardware/software combination, such as a processor executing software; or a combination thereof. For example, a processor may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The memory cell array 210 may be connected to one or more string selection lines SSLs, a plurality of word lines WL1 through WLm (including normal word lines and dummy word lines), one or more ground selection lines GSLs, and a plurality of bit lines BL1 through BLn. The voltage generator 220 may be configured to generate one or more word line voltages V1 through Vi which may be provided to the row decoder 240. Data to be programmed may be provided to the memory cell array 210 through the input/output circuit 250, and read data may be provided to an outside through the input/output circuit 250. The control logic 260 may be configured to provide various control signals associated with memory operations to the row decoder 240, the voltage generator 220, and the voltage level detector 230.

The voltage level detector 230 may be electrically connected to various word line voltage delivery paths. Word lines that are subject to voltage level detection may include a normal word line and a dummy word line, and may include a string selection line SSL and a ground selection line GSL. Thus, in some example embodiments of the present disclosure are described, the word lines that are subject to voltage level detection may be include a string selection line SSL, normal and dummy word lines, and a ground selection line GSL. As distinguished from a string selection line SSL and a ground selection line GSL, a word line may include a normal word line and a dummy word line. While the voltage level detector 230 is illustrated as being electrically connected to an output terminal of the voltage generator 220 in FIG. 2, some example embodiments of the present disclosure are not limited thereto. For example, the voltage level detector 230 may be electrically connected to various word lines SSLs, WL1 through WLm, and GSLs included in the memory cell array 210 to detect a word line defect.

Through a decoding operation of the row decoder 240, the word line voltages V1 through Vi may be provided to various word lines SSLs, WL1 through WLm, and GSLs. For example, the word line voltages V1 through Vi may include a string selection voltage, a word line voltage, a word line voltage, and a ground selection voltage, in which the string selection voltage may be provided to one or more string selection lines SSLs, the word line voltage may be provided to one or more word lines (including dummy and normal word lines WL1 through WLm), and the ground selection voltage may be provided to one or more ground selection lines GSLs. A progressive defect may occur in word lines of the memory device 200, and the voltage level detector 230 may generate a pass/fail signal (P/F) indicating a word line defect by detecting the word line voltages V1 through Vi.

Figure 3:
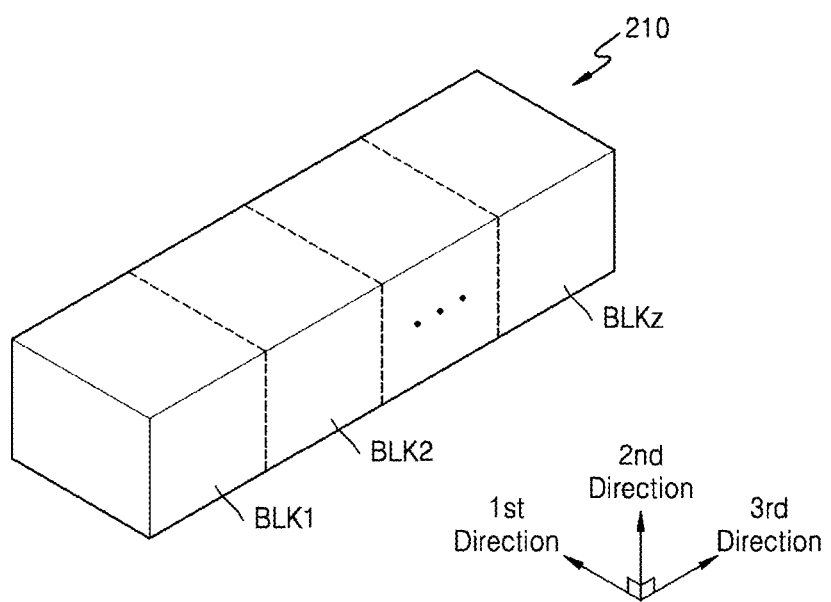
FIG. 3 is a block diagram of a memory cell array illustrated in FIG. 1.

FIG. 3 is a block diagram of a memory cell array illustrated in FIG. 1.

Referring to FIG. 3, the memory cell array 210 may include a plurality of memory blocks BLK1 through BLKz. Each memory block BLK has a three-dimensional (3D) (or vertical) structure. For example, each memory block BLK may include structures extending in first through third directions. For example, each memory block BLK may include a plurality of NAND strings NS extending in a second direction. The plurality of NAND strings NS may be provided in the first and third directions.

Each NAND string NS may be connected to a bit line BL, a string selection line SSL, a ground selection line GSL, word lines WL, and a common source line CSL. That is, each memory block BLK may be connected to a plurality of bit lines BL, a plurality of string selection lines SSL, a plurality of ground selection lines GSL, a plurality of word lines WL, and a common source line CSL. The memory blocks BLK1 through BLKz will be described in more detail with reference to FIG. 4.

Figure 4:
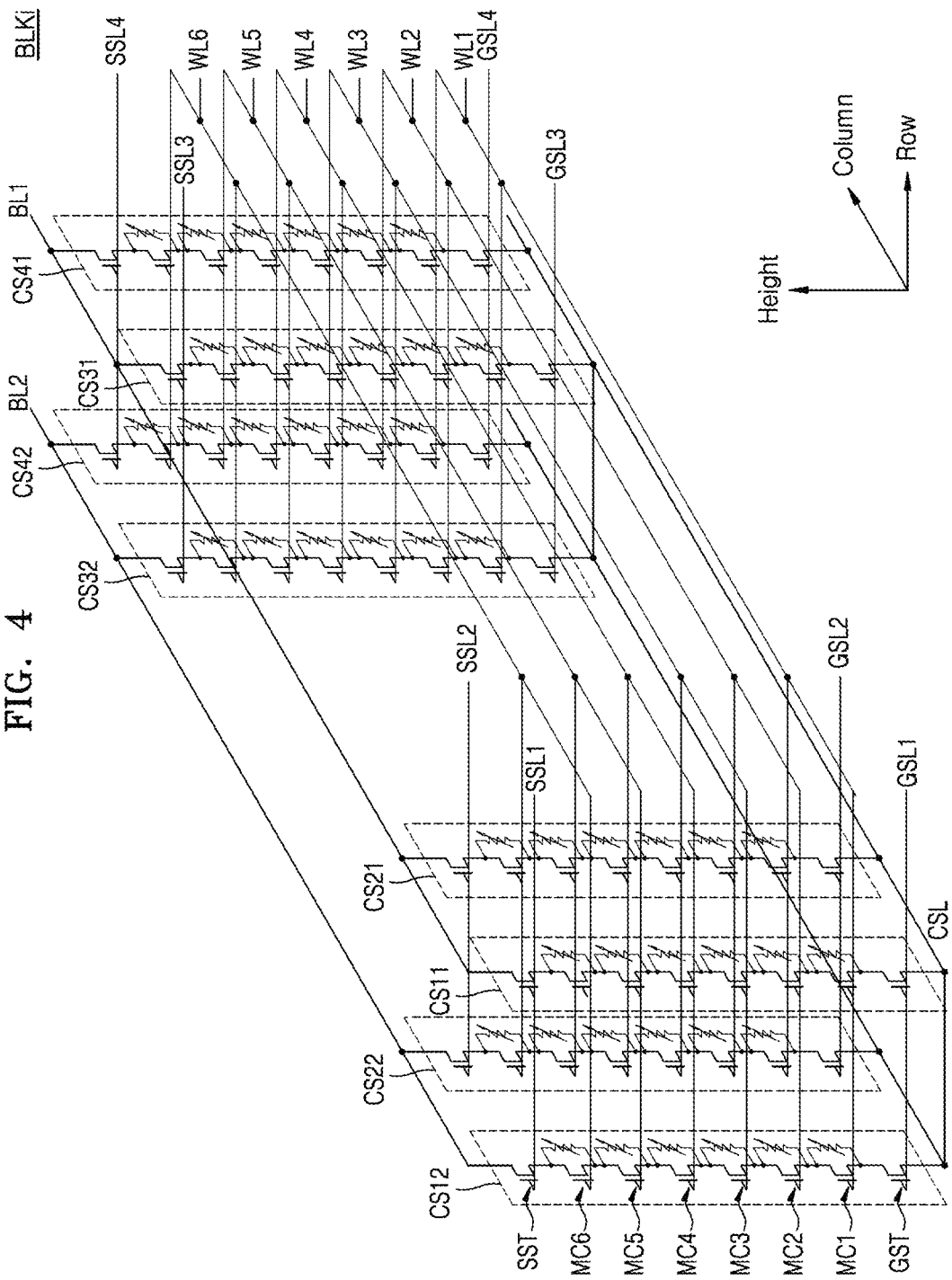
FIG. 4 is a circuit diagram corresponding to a memory block based on a read operation being performed, according to some example embodiments.

FIG. 4 is a circuit diagram corresponding to a memory block based on a read operation being performed, according to some example embodiments.

As an example, one of the memory blocks BLK1 BLKz of the memory cell array 210 of FIG. 3 is illustrated in FIG. 4.

Referring to FIGS. 3 and 4, the memory block BLKi may include a plurality of cell strings CS11~CS41 and CS12~CS42. The plurality of cell strings CS11~CS41 and CS12~CS42 are arranged in a column direction and a row direction to form columns and rows.

Each cell string may include a ground selection transistor GST, memory cells MC1 through MC6, and a string selection transistor SST. The ground selection transistor GST, the memory cells MC1~MC6, and the string selection transistor SST of each cell string may be stacked in a height direction that is different than the direction in which the substrate extends, for example, perpendicular to a substrate.

The rows of the plurality of cell strings CS11~CS41 and CS12~CS42 may be connected to different string selection lines SSL1~SSL4, respectively. For example, string selection transistors SST of the cell strings CS11 and CS12 may be connected to the string selection line SSL1 in common. String selection transistors SST of the cell strings CS21 and CS22 may be connected to the string selection line SSL2 in common. String selection transistors SST of the cell strings CS31 and CS32 may be connected to the string selection line SSL3 in common. String selection transistors SST of the cell strings CS41 and CS42 may be connected to the string selection line SSL4 in common.

Columns of the cell strings CS11~CS41 and CS12~CS42 may be connected to different bit lines BL1 and BL2, respectively. For example, selection transistors SST of the cell strings CS11~CS41 may be connected to the bit line BL1 in common. String transistors SST of the cell strings CS12 and CS42 may be connected to the bit line BL2 in common.

Rows of the cell strings CS11~CS41 and CS12~CS42 may be connected to different ground selection lines GSL1~GSL4, respectively. For example, ground selection transistors GST of the cell strings CS11 and CS12 may be connected to the ground selection line GSL1 in common. Ground selection transistors GST of the cell strings CS21 and CS22 may be connected to the ground selection line GSL2 in common. Ground selection transistors GST of the cell strings CS31 and CS32 may be connected to the ground selection line GSL3 in common. Ground selection transistors GST of the cell strings CS41 and CS42 may be connected to the ground selection line GSL4 in common.

Memory cells disposed at the same or similar height from a substrate (or ground selection transistors GST) may be connected to one word line in common and memory cells disposed at different heights from the substrate may be connected to different word lines WL1~WL6, respectively. For example, memory cells MC1 may be connected to the word line WL1 in common. Memory cells MC2 may be connected to the word line WL2 in common. Memory cells MC3 may be connected to the word line WL3 in common. Memory cells MC4 may be connected to the word line WL4 in common. Memory cells MC5 may be connected to the word line WL5 in common. Memory cells MC6 may be connected to the word line WL6 in common.

Ground selection transistors GST of the cell strings CS11~CS41 and CS12~CS42 may be connected to a common source line CSL in common.

Based on (e.g., when) a read operation being performed with respect to the memory block BLKi, each of the memory cells MC1 through MC6 may correspond to a circuit in which a transistor and a resistor are connected in parallel.

Although not shown in FIG. 4, based on a program operation or an erase operation being performed with respect to the memory block BLKi, each of the memory cells MC1 through MC6 may correspond to a resistor.

The memory block BLKi illustrated in FIG. 4 is an example. The present disclosure including example embodiments are not limited to the memory block BLKi illustrated in FIG. 4. For example, the number of rows of the cell strings may increase or decrease. As the number of rows of the cell strings is changed, the number of string selection lines connected to the rows of the cell strings and/or the number of cell strings connected to one bit line may be changed. As the number of rows of the cell strings is changed, the number of ground selection lines connected to the rows of the cell strings may also be changed.

The number of columns of the cell strings may increase or decrease. As the number of columns of the cell strings is changed, the number of bit lines connected to the columns of the cell strings and/or the number of cell strings connected to one string selection line may also be changed.

A height of the cell strings may increase or decrease. For example, the number of memory cells being stacked on each cell string may increase or decrease. As the number of memory cells being stacked on each cell string is changed, the number of word lines may be changed. For example, the number of string selection transistors or ground selection transistors being provided to each cell string may increase. As the number of string selection transistors or ground selection transistors being provided to each cell string is changed, the number of string selection lines or ground selection lines may also be changed. Based on the number of string selection lines or ground selection lines increasing, the string selection transistors or the ground selection transistors may be stacked in the same form as the memory cells MC1~MC6.

As an example, write and read operations may be performed by a row unit of the cell strings CS11~CS41 and CS12~CS42. The cell strings CS11~CS41 and CS12~CS42 may be selected by one row unit by the ground selection lines GSL1~GSL4, and the cell strings CS11~CS41 and CS12~CS42 may be selected by one row unit by the string selection lines CSL1~CSL4. A voltage may be applied to the ground selection lines GSL1~GSL4 considering at least two ground selection lines, such as GSL1 and GSL2, or GSL3 and GSL4, as one unit. A voltage may be applied to the ground selection lines GSL1~GSL4 considering the whole ground selection lines GSL1~GSL4 as one unit.

In a selected row of the cell strings CS11~CS41 and CS12~CS42, write and read operations may be performed by a page unit. The page may be one row of memory cells connected to one word line. In the selected row of the cell strings CS11~CS41 and CS12~CS42, memory cells may be selected by a page unit by the word lines WL1~WL6.

Figure 5:
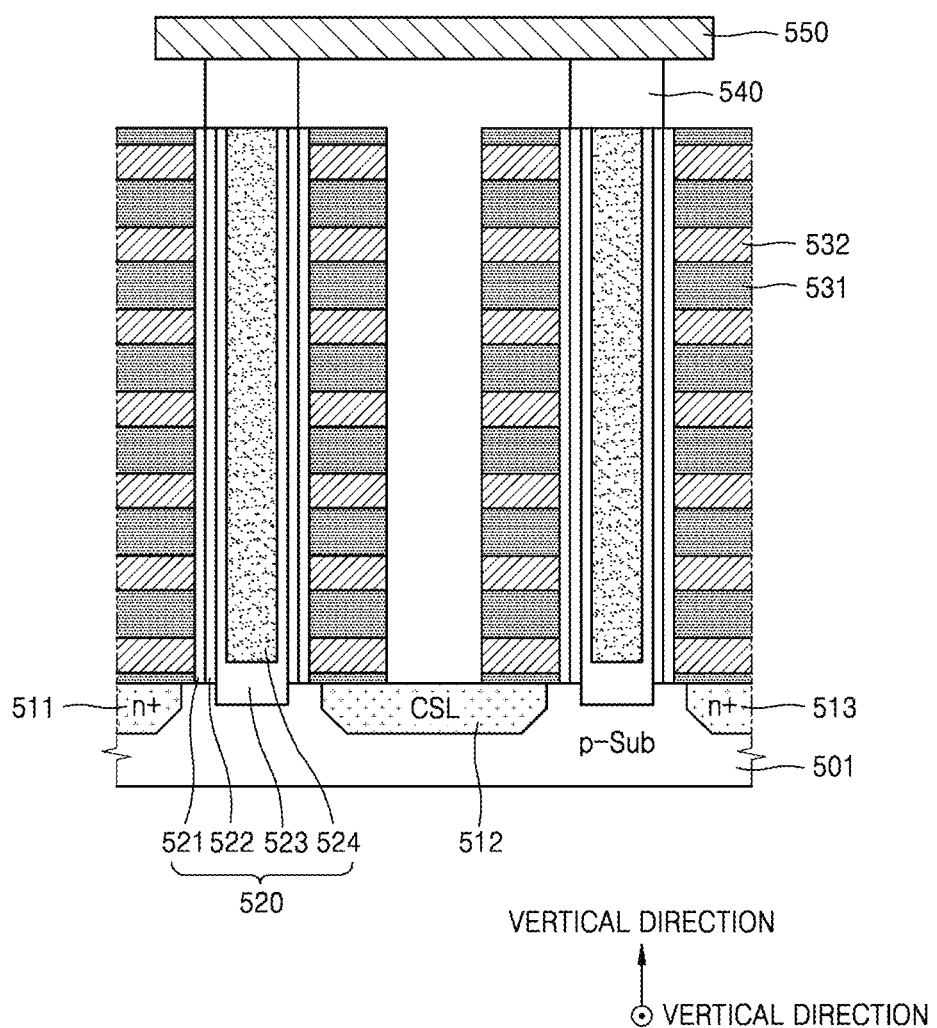
FIG. 5 illustrates an example of a configuration corresponding to a memory block according to some example embodiments.

FIG. 5 illustrates an example of a configuration corresponding to a memory block according to some example embodiments.

First, a substrate 501 may be provided. The substrate 501 may include a silicon material doped with a first-type impurity. For example, the substrate 501 may include a silicon material doped with a p-type impurity. For example, the substrate 501 may include a p-type well (e.g., a pocket p well). Hereinbelow, it is assumed that the substrate 501 is p-type silicon. However, the substrate 501 is not limited to p-type silicon, and may vary either in impurity type (for example, may be n-type silicon) and/or material (for example, may be gallium arsenide or graphene).

A plurality of doping regions 511 through 513 may be disposed on the substrate 501. For example, the doping regions 511 through 513 may be of a second type that is different from that of the substrate 501. For example, the doping regions 511 through 513 may be of an n type. Hereinbelow, it is assumed that the first through third doping regions 511 through 513 be of the n type. However, the first through doping regions 511 through 513 are not limited to the n type (for example, may be a p type doping region).

A gate stack including a plurality of gates 531 and a plurality of insulators 532 extending in a horizontal direction may intersect each other on the corresponding substrate 501 between the first and second doping regions 511 and 512. That is, the plurality of gates 531 and the plurality of insulators 532 of the gate stack may be stacked intersecting each other in a vertical direction that is different than the direction in which the substrate extends, for example, a vertical direction that is perpendicular to the horizontal direction. For example, the gate 531 may include a metal material (e.g., copper, silver, etc.), and/or the plurality of insulators 532 may include, but not limited to, a silicon oxide.

A plurality of pillars 520 penetrating through the plurality of stacked gates 531 and/or the plurality of stacked insulators 532 in the vertical direction may be provided on the corresponding substrate 501 between the first and second doping regions 511 and 512.

Each pillar 520 may include a plurality of layers. In some example embodiments, an outermost layer of each pillar 520 may include a gate oxide layer 521. For example, the gate oxide layer 521 may include a silicon oxide. The gate oxide layer 521 may be conformally deposited in the pillar 520.

A resistance switching layer 522 may be conformally deposited along an inner surface of the gate oxide layer 521. In some example embodiments, the resistance switching layer 522 may include a transition metal oxide or nitride. For example, the resistance switching layer 522 may include an oxide of at least one element selected from a group including zirconium (Zr), hafnium (Hf), aluminum (Al), nickel (Ni), copper (Cu), molybdenum (Mo), tantalum (Ta), titanium (Ti), tungsten (W), chrome (Cr), strontium (Sr), lanthanum (La), manganese (Mn), calcium (Ca), praseodymium (Pr), and silicon (Si). The resistance switching layer 522 may include a silicon nitride and an aluminum nitride.

A semiconductor layer 523 may be conformally deposited along an inner surface of the resistance switching layer 522. In some example embodiments, the semiconductor layer 523 may include a silicon material doped as a first type. The semiconductor layer 523 may include a silicon material doped as the same type as the substrate 501. For example, if the substrate 501 includes a silicon material doped as a p type, the semiconductor layer 523 may also include a silicon material doped as a p type.

An insulating layer 524 may be filled in the semiconductor layer 523. For example, the insulating layer 524 may include a silicon oxide.

In a region between the second and third doping regions 512 and 513, the same or similar structure as a structure on the first and second doping regions 511 and 512 may be disposed.

A drain 540 may be provided on the pillar 520. The drain 540 may include a silicon material doped as a second type. For example, the drain 540 may include a silicon material doped as an n type.

On the drain 540, a conductive material 550 may be provided. The drain 540 and the conductive material 550 may be connected through a contact plug. The conductive material 550 may include a metal material, for example, polysilicon.

When compared to FIG. 4, the cell strings CS11~CS41 and CS12~CS42 may be formed by the plurality of gates 531, the plurality of insulators 532, the gate oxide layer 521, the resistance switching layer 522, and the semiconductor layer 523. Each cell string may include a ground selection transistor GST, memory cells MC1~MC6, and a string selection transistor SST.

Figure 6:
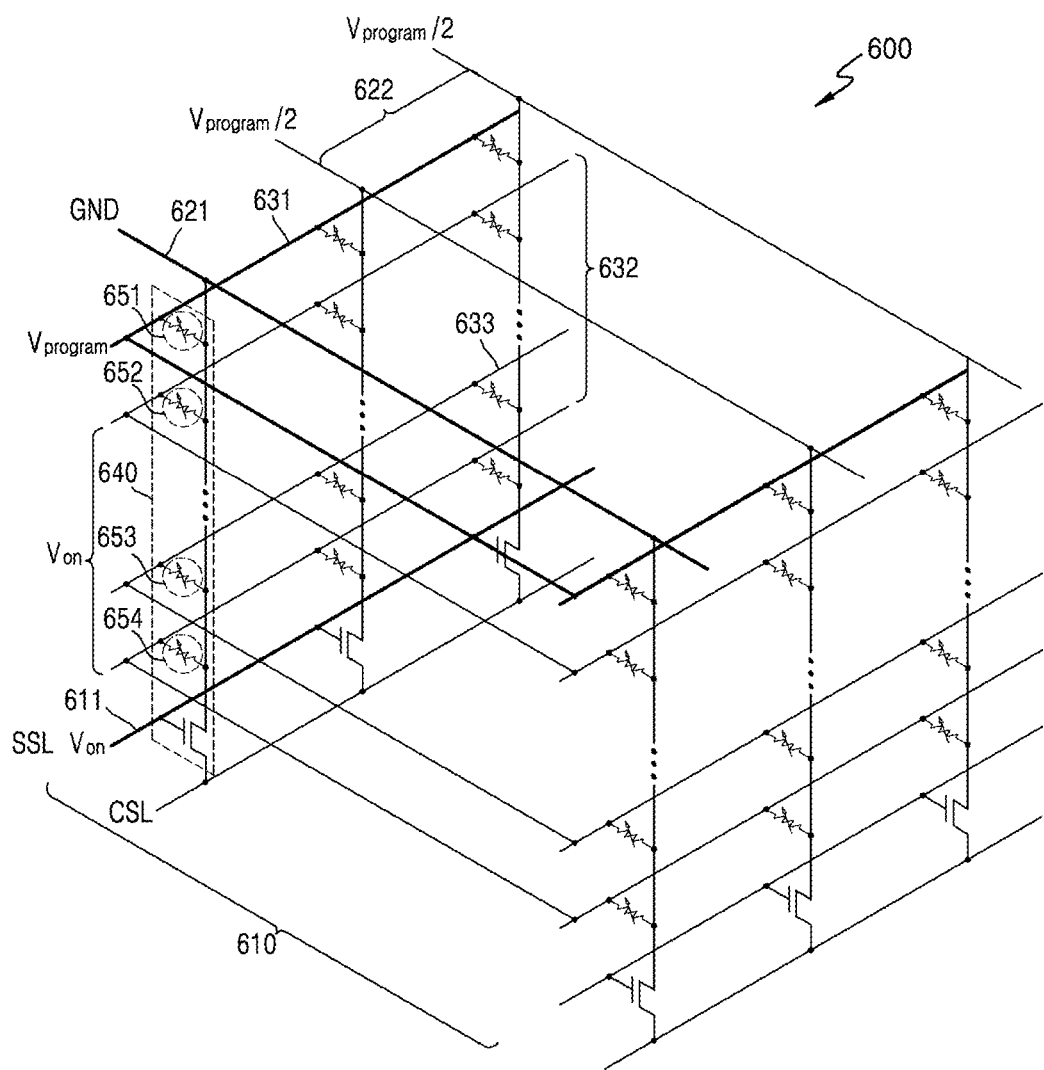
FIG. 6 illustrates a circuit corresponding to a memory block illustrated in FIG. 5 based on a program or erase operation being performed, according to some example embodiments.
Figure 7:
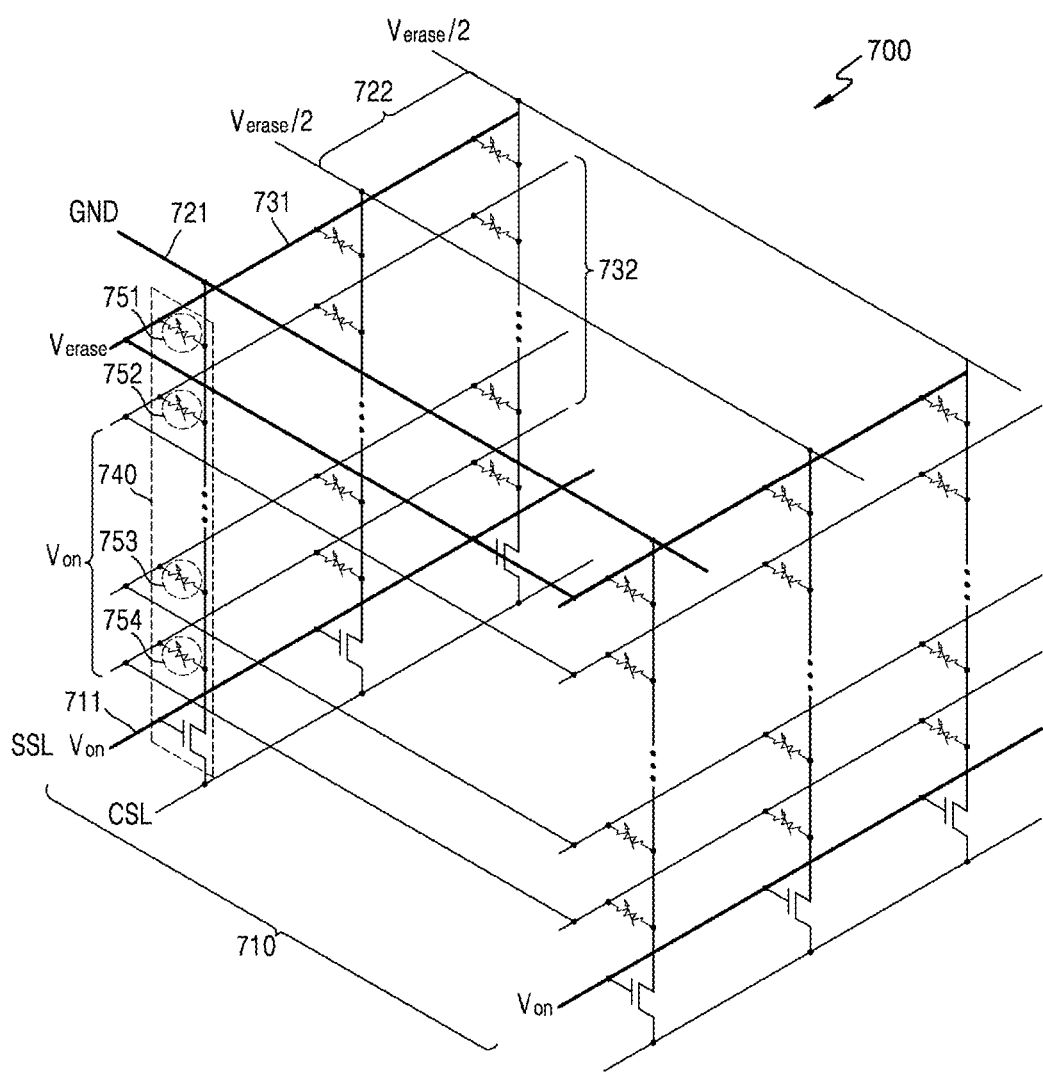
FIG. 7 illustrates a circuit corresponding to a memory block illustrated in FIG. 5 based on an erase operation being performed, according to some example embodiments.

In some example embodiments, memory cells MC1~MC6 included in the cell string may correspond to different circuits depending on an operation type of a memory block. In some example embodiments, based on a program operation or an erase operation being performed with respect to a memory block, a ground channel may be performed in the semiconductor layer 523 and each of the plurality of gates 531 may be serially connected to the resistance switching layer 522 and the ground channel. In other words, based on the program operation or the erase operation being performed with respect to the memory block, each of the memory cells MC1~MC6 included in the cell string formed between the plurality of gates 531 and the semiconductor layer 523 may correspond to a resistor. With reference to FIGS. 6 and 7, a detailed description will be made of a circuit corresponding to a memory block based on the program operation or the erase operation being performed.

In some example embodiments, based on the read operation being performed with respect to the memory block, the gate 531, the semiconductor layer 523, and the gate oxide layer 521 may correspond to a transistor, and the transistor corresponding to each of the plurality of gates 531 and the resistance switching layer 522 may be connected in parallel. In other words, based on the read operation being performed with respect to the memory block, each of the memory cells MC1~MC6 included in the cell string formed between the plurality of gates 531 and the semiconductor layer 523 may correspond to a circuit in which a transistor and a resistor are connected in parallel with each other. With reference to FIG. 7, a detailed description will be made of a circuit corresponding to a memory block based on the read operation being performed.

According to the present disclosure, by constituting a memory block by using the resistance switching layer 522 instead of by using a phase change material, generation of heat or stress (pressure) in a memory block due to the use of the phase change material may be prevented, reduced, and/or mitigated. Moreover, by making and operating the memory block as described above, an ion movement between adjacent memory cells and a resultant leakage current or operation failure may be prevented, reduced, and/or mitigated based on the memory cells included in the memory block operating repeatedly. Furthermore, the memory block according to the present disclosure may address a scaling issue between memory cells in next-generation VNAND, thereby increasing density thereof.

In some example embodiments, the memory block according to the present disclosure may be implemented in the form of a chip for use as a neuromorphic computing platform. The memory block according to the present disclosure may be implemented in the form of a chip in order to be used to construct a neural network.

FIG. 6 illustrates a circuit corresponding to a memory block illustrated in FIG. 5 based on a program or erase operation being performed, according to some example embodiments.

FIG. 6 illustrates a circuit corresponding a memory block 600 in a program operation. Referring to FIG. 5, a plurality of memory cells 651 through 654 included in a cell string 640 may be formed from the gate 531, the gate oxide layer 521, the resistance switching layer 522, and the semiconductor layer 523.

The cell string 640 of the memory block 600 may include the selected memory cell 651 and the non-selected memory cells 652 through 654. Hereinafter, the selected memory cell 651 may be subject to the program operation.

In some example embodiments, a control logic that is configured to control the memory block 600 may perform the program operation with respect to the selected memory cell 651 included in the cell string 640. The control logic may be configured to apply a first positive voltage $V_{on}$ to a string selection line 611 connected to the selected memory cell 651 among a plurality of string selection lines 610. The control logic may be configured to ground a selected bit line 621 connected to the selected memory cell 651 to a ground voltage GND among a plurality of bit lines 621 and 622, and apply a second positive voltage $V_{program}$ that is greater than the first positive voltage $V_{on}$ to a selected word line 631 connected to the selected memory cell 651 among a plurality of selected word lines 631 and 632. The control logic may be configured to apply the first positive voltage $V_{on}$ to the word line 632 connected to the non-selected memory cells 652 through 654. Thus, the control logic may be configured to perform some or all of the program operation with respect to the selected memory cell 651.

As described with reference to FIG. 5, in the program operation, each of the plurality of memory cells 651 through 654 included in the cell string 640 may correspond to a resistor.

More specifically, referring to FIG. 5, the plurality of memory cells 651 through 654 included in the cell string 640 may be formed from the gate 531, the gate oxide layer 521, the resistance switching layer 522, and the semiconductor layer 523.

The gate 531, the semiconductor layer 523, and the gate oxide layer 521 may form a transistor. In a program (or erase) operation process, to suppress production of leakage current due to formation of a current conduction path by oxygen vacancies in the resistance switching layer 522, the gate oxide layer 521 is arranged between the gate 531 and the resistance switching layer 522. Due to a role of the gate oxide layer 521, the gate 531, the semiconductor layer 523, and the gate oxide layer 521 may form a transistor.

The resistance switching layer 522 may correspond to a resistor. Each of the plurality of memory cells 651 through 654 may operate as a transistor and a resistor (that is, the resistance switching layer 522) connected in parallel.

The control logic may be configured to apply the voltages $V_{on}$ and/or $V_{program}$ that are sufficient to turn on transistors included in the plurality of memory cells 651 through 654 to the word lines 631 and 632 connected to the plurality of memory cells 651 through 654. As the transistors included in the plurality of memory cells 651 through 654 are turned on, a ground channel may be formed on the semiconductor layer 523. That is, based on the control logic performing the program operation, the bit line 621 connected to the selected memory cell 651 may be grounded, the voltage $V_{on}$ may be applied to the word line 632 connected to the non-selected memory cells 652 through 654, and the ground channel may be formed on the semiconductor layer as the voltage $V_{program}$ is applied to the selected memory cell 651. In some example embodiments, processing circuitry (such as the voltage generator 220, the row decoder 240, and/or the control logic 260) may cause the bit line 621 to be grounded, the voltage $V_{on}$ to be applied to the word line 632, and/or the ground channel to be formed.

In some example embodiments, based on the ground channel being formed on the semiconductor layer 523, the voltage $V_{on}$ may be applied to the word line 632 connected to the non-selected memory cells 652 through 654. Based on the voltage $V_{program}$ being applied to the word line 631 connected to the selected memory cell 651, a voltage difference may occur between the gate 531 and the semiconductor layer 523 that form each of the plurality of memory cells 651 through 654. In some example embodiments, processing circuitry (such as the voltage generator 220, the row decoder 240, and/or the control logic 260) may cause the voltage $V_{program}$ to be applied to the word line 631. In this case, the gate 531 forming each of the plurality of memory cells 651 through 654 may correspond to an upper electrode, the semiconductor layer 523 forming each of the plurality of memory cells 651 through 654 may correspond to a lower electrode, and the resistance switching layer 522 may correspond to a resistor between the upper electrode and the lower electrode. That is, each of the plurality of memory cells 651 through 654 may correspond to a circuit in which the resistor corresponding to the resistance switching layer 522 and the ground channel formed on the semiconductor layer 523 are serially connected to each other.

Based on the program operation being performed with respect to the selected memory cell 651, the control logic may be configured to apply the voltage $V_{on}$ to the string selection line 611 connected to the selected memory cell 651 and the word line 632 connected to the non-selected memory cells 652 through 654 among the plurality of string selection lines 610. The control logic may be configured to apply the voltage $V_{program}$ that is higher than the voltage $V_{on}$ to the selected word line 631 connected to the selected memory cell 651.

Herein, the voltage $V_{on}$ is a voltage suitable for turning on the transistors included in the non-selected memory cells 652 through 654, but that is not sufficient to move oxygen vacancies in the non-selected memory cells 652 through 654, and may be, for example, 2V through 3V. That is, the voltage $V_{on}$ applied to the word line 632 connected to the non-selected memory cells 652 through 654 may be a voltage that is not sufficient to move oxygen vacancies in the non-selected memory cells 652 through 654. The voltage $V_{program}$, which is higher than the voltage $V_{on}$, is a voltage suitable for turning on the transistor included in the selected memory cell 651 and also for moving oxygen vacancies in the selected memory cell 651 toward the semiconductor layer 523, and may be, for example, 5V through 6V.

In the example embodiments presented herein, the voltages $V_{on}$ and $V_{program}$ are examples and may vary, for example, based on a type of a material, a thickness, etc., of the gate 531, the gate oxide layer 521, the resistance switching layer 522, and the semiconductor layer 523 forming the plurality of memory cells 651 through 654.

In the case that the program operation is performed with respect to the selected memory cell 651, the selected memory cell 651 may enter a low resistance state as oxygen vacancies in the selected memory cell 651 moves toward the semiconductor layer 523 based on the voltage $V_{program}$ to the selected word line 631 connected to the selected memory cell 651. The selected memory cell 651 entering the low resistance state may indicate that a value of a resistor included in the selected memory cell 651 is reduced. The selected memory cell 651 may have an ohmic conductive property in the low resistance state.

In some example embodiments, the value of the resistor included in the selected memory cell 651 in the low resistance state may be greater than a resistance of the ground channel formed on the semiconductor layer 523. In this way, interference from the non-selected memory cells 652 through 654 may be prevented.

After the voltage $V_{program}$ is applied to the selected word line 631 connected to the selected memory cell 651 and thus the selected memory cell 651 enters the low resistance state, the control logic may be configured to perform the read operation with respect to the selected memory cell 651. The control logic may be configured to apply a read voltage to the bit line 621 connected to the selected memory cell 651 to perform the read operation. In the case that the read operation is performed after the program operation is performed with respect to the selected memory cell 651, a value of read current detected from the bit line 621 may be greater than a desired, preset, and/or selected value as the selected memory cell 651 enters the low resistance state. Herein, the desired, preset, and/or selected value may be a value of read current in an unprogrammed state of the selected memory cell 651.

In some example embodiments, based on the program operation being performed with respect to the selected memory cell 651, the control logic may be configured to apply a positive voltage that is less than that of the voltage $V_{program}$ to the other bit line 622. The control logic may be configured to prevent or reduce a change in the resistance state of the non-selected memory cells connected to the other bit line 622, for example, by applying a positive voltage that is less than the voltage $V_{on}$ to the other bit line 622. For example, a magnitude of the positive voltage that is applied to the other bit line 622 may be, but not limited to, $V_{program}/2$.

In some example embodiments, the control logic may simultaneously (e.g., concurrently) perform the program operation with respect to two or more cell memories among the plurality of memory cells 651 through 654 included in the cell string 640. In some other example embodiments, the control logic may sequentially, or concurrently in part and sequentially in part, perform the program operation with respect to two or more cell memories among the plurality of memory cells 651 through 654 included in the cell string 640.

In some example embodiments, the control logic may be configured to perform the program operation with respect to two selected memory cells 651 and 653 included in the cell string 640. The control logic may be configured to apply the first positive voltage $V_{on}$ to the string selection line 611 connected to two selected memory cells 651 and 653, among the plurality of string selection lines 610. The control logic may be configured to ground the selected bit line 621 connected to the two selected memory cells 651 and 653 to the ground voltage GND among the plurality of bit lines 621 and 622, and apply the second positive voltage $V_{program}$ that is greater than the first positive voltage $V_{on}$ to two selected word line 631 and 633 connected to the two selected memory cells 651 and 653 among the plurality of selected word lines 631 and 632. The control logic may be configured to apply the first positive voltage $V_{on}$ to the word line connected to the non-selected memory cells 652 and 654. Thus, the control logic may be configured to perform the program operation with respect to the two selected memory cells 651 and 653 at the same time.

FIG. 7 illustrates a circuit corresponding to a memory block illustrated in FIG. 5 based on an erase operation being performed, according to some example embodiments.

In FIG. 7 is illustrated a circuit corresponding a memory block 700 in the erase operation. Referring to FIG. 5, a plurality of memory cells 751 through 754 included in a cell string 740 may be formed from the gate 531, the gate oxide layer 521, the resistance switching layer 522, and the semiconductor layer 523. The cell string 740 of the memory block 700 may include the selected memory cell 751 and the non-selected memory cells 752 through 754. Hereinafter, the selected memory cell 751 may be subject to the erase operation.

In some example embodiments, a control logic of the memory block 700 may be configured to perform the erase operation with respect to the selected memory cell 751 included in the cell string 740. The control logic may be configured to apply a first positive voltage $V_{on}$ to a string selection line 711 connected to the selected memory cell 751, among a plurality of string selection lines 710. The control logic may be configured to ground a selected bit line 721 connected to the selected memory cell 751 to the ground voltage GND among a plurality of bit lines 721 and 722, and/or to apply a negative voltage $V_{erase}$ having an absolute value that is greater than the absolute value of the first positive voltage $V_{on}$ to a selected word line 731 connected to the selected memory cell 751 among a plurality of selected word lines 731 and 732. The control logic may be configured to apply the first positive voltage $V_{on}$ to the word line 732 connected to the non-selected memory cells 752 through 754. Thus, the control logic may be configured to perform the erase operation with respect to the selected memory cell 751.

As described with reference to FIG. 5, in the erase operation, each of the plurality of memory cells 751 through 754 included in the cell string 740 may correspond to a resistor.

More specifically, referring to FIG. 5, the plurality of memory cells 751 through 754 included in the cell string 740 may be formed from the gate 531, the gate oxide layer 521, the resistance switching layer 522, and the semiconductor layer 523. The gate 531, the semiconductor layer 523, and the gate oxide layer 521 may form a transistor, and the resistance switching layer 522 may correspond to a resistor. That is, each of the plurality of memory cells 751 through 754 may include a transistor and a resistor.

The control logic may be configured to apply the voltage $V_{on}$ that is sufficient to turn on transistors included in the non-selected memory cells 752 through 754 to the word line 732 connected to the non-selected memory cells 752 through 754, thus turning on the transistors included in the non-selected memory cells 752 through 754. The control logic 260 may be configured to cause the voltage $V_{erase}$ to be applied to the selected memory cell 751 and to cause the transistor included in the selected memory cell 751 to be turned off, and to cause the transistor included in the adjacent non-selected memory cell 752 to be turned on and the voltage $V_{on}$ to be applied to the word line 732 (e.g., by processing circuitry, such as the control logic 260) connected to the non-selected memory cells 752 through 754, such that a fringing field effect may occur, and may therefore cause the ground channel to be formed on the semiconductor layer 523.

That is, the control logic 260 may be further configured to perform the erase operation by causing the bit line 721 connected to the selected memory cell 751 to be grounded, by causing the voltage $V_{on}$ to be applied to the word line 732 connected to the non-selected memory cells 752 through 754, by causing the ground channel to be formed on the semiconductor layer, and by causing the voltage $V_{program}$ to be applied to the selected memory cell 751.

In some example embodiments, the control logic 260 may be further configured to, based on the ground channel being formed on the semiconductor layer 523, cause the voltage $V_{on}$ to be applied to the word line 732 connected to the non-selected memory cells 752 through 754, cause the voltage $V_{erase}$ to be applied to the word line 731 connected to the selected memory cell 751, and cause a voltage difference between the gate 531 and the semiconductor layer 523 that form each of the plurality of memory cells 751 through 754. In this case, the gate 531 forming each of the plurality of memory cells 751 through 754 may correspond to an upper electrode, the semiconductor layer 523 forming each of the plurality of memory cells 651 through 654 may correspond to a lower electrode, and the resistance switching layer 522 may correspond to a resistor between the upper electrode and the lower electrode. That is, each of the plurality of memory cells 751 through 754 may correspond to a circuit in which the resistor corresponding to the resistance switching layer 522 and the ground channel formed on the semiconductor layer 523 are serially connected to each other.

In some example embodiments, the control logic may be configured to apply the voltage $V_{on}$ to the string selection line 711 connected to the selected memory cell 751 and the word line 732 connected to the non-selected memory cells 752 through 754 among the plurality of string selection lines 710 and to apply the voltage $V_{erase}$ to the selected word line 731 connected to the selected memory cell 751 based on the erase operation being performed with respect to the selected memory cell 751. Herein, the voltage $V_{on}$ is a voltage suitable for turning on the transistors included in the non-selected memory cells 752 through 754 but that is not sufficient to move oxygen vacancies in the non-selected memory cells 752 through 754, and may be, for example, 2V through 3V. The voltage $V_{erase}$ applied to the selected word line 731 connected to the selected memory cell 751 is a voltage suitable for moving oxygen vacancies in the selected memory cell 751 in a direction opposite to the semiconductor layer 523, and may be, for example, −5V through −6V.

In some example embodiments, the voltages $V_{on}$ and $V_{erase}$ are examples and may vary with a type of a material, a thickness, etc., of the gate 531, the gate oxide layer 521, the resistance switching layer 522, and the semiconductor layer 523 forming the plurality of memory cells 751 through 754. The voltage $V_{erase}$ may have an absolute value that is equal or similar to the absolute value of the voltage $V_{program}$ applied to the selected memory cell in the program operation.

In some example embodiments, the selected memory cell 751 may be configured to enter a high resistance state as oxygen vacancies in the selected memory cell 751 move in a direction opposite to the semiconductor layer 523 based on the voltage $V_{erase}$ to the selected word line 731 connected to the selected memory cell 751 based on the erase operation being performed with respect to the selected memory cell 751 by. The selected memory cell 751 entering the high resistance state may indicate that a value of a resistor included in the selected memory cell 751 increases.

After the voltage $V_{erase}$ is applied to the selected word line 731 connected to the selected memory cell 751 and thus the selected memory cell 751 enters the high resistance state, the control logic may be configured to perform the read operation with respect to the selected memory cell 751. The control logic may be configured to perform the read operation by applying a read voltage to the bit line 721 connected to the selected memory cell 751. In the case that the read operation is performed after the erase operation is performed with respect to the selected memory cell 751, a value of read current detected from the bit line 721 may be less than a desired, preset, and/or selected value as the selected memory cell 751 enters the high resistance state. Herein, the desired, preset, and/or selected value may be a value of read current in an unerased state of the selected memory cell 751.

In some example embodiments, the control logic may be configured to apply a negative voltage having a magnitude or absolute value that is less than the magnitude or absolute value of the voltage $V_{erase}$ applied to the bit line 721 to the other bit line 722 based on the erase operation being performed with respect to the selected memory cell 751, thereby preventing a change in resistance states of the non-selected memory cells connected to the other bit line 722. For example, a magnitude of a negative voltage applied to the other bit line 722 may be, but not limited to, $V_{erase}/2$.

Figure 8:
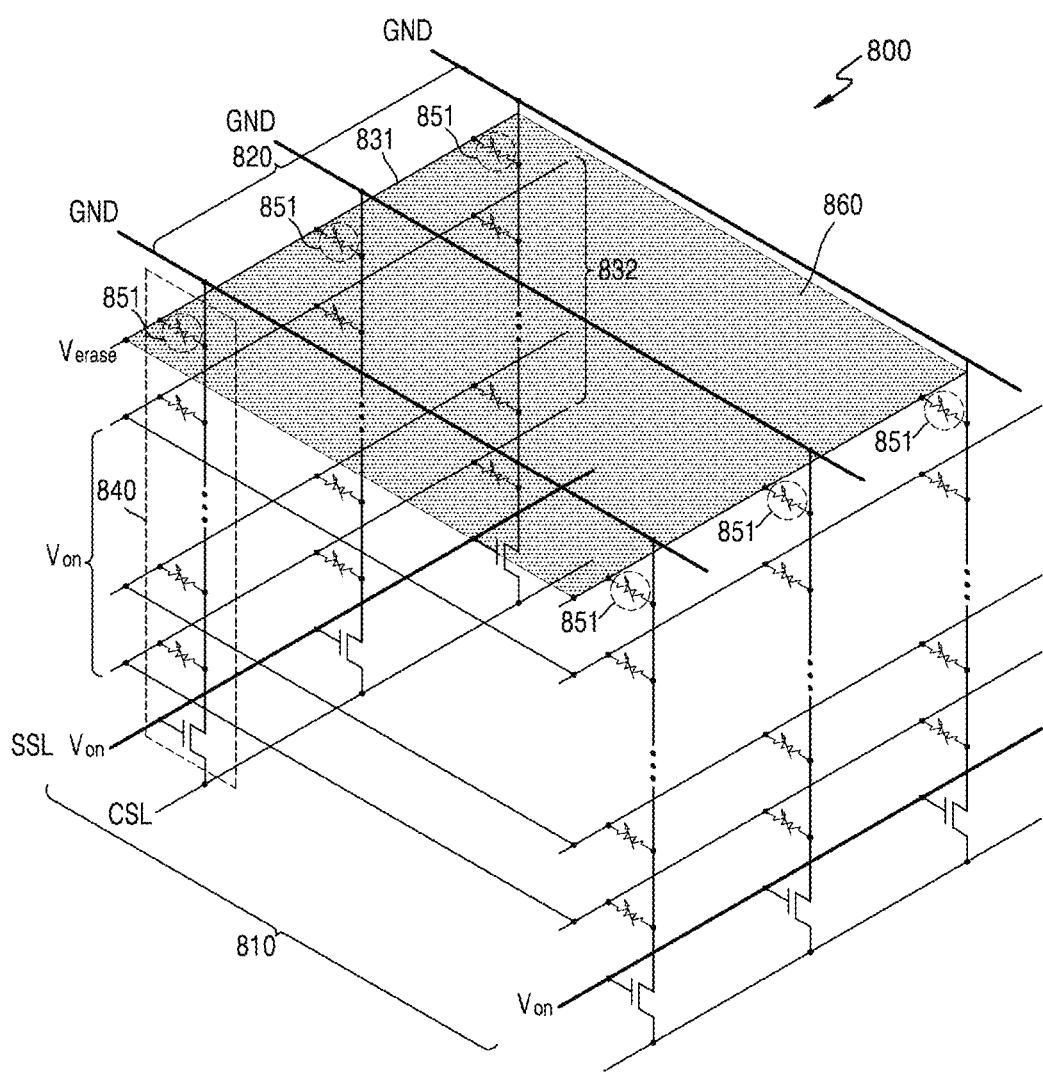
FIG. 8 illustrates a circuit corresponding to a memory block illustrated in FIG. 5 based on an erase operation being performed with respect to a word plane, according to some example embodiments.

FIG. 8 illustrates a circuit corresponding to a memory block illustrated in FIG. 5 based on an erase operation being performed with respect to a word plane, according to some example embodiments.

In FIG. 8 is illustrated a circuit corresponding a memory block 800 in the erase operation. Referring to FIG. 5, a plurality of memory cells 851 through 854 included in a cell string 840 may be formed from the gate 531, the gate oxide layer 521, the resistance switching layer 522, and the semiconductor layer 523.

In the following description, a description that overlaps that of FIG. 7 are not reproduced.

The memory block 800 may include a plurality of selected memory cells 851 and non-selected memory cells. Hereinafter, the plurality of selected memory cells 851 may be subject to the erase operation.

A word plane 860 may include the plurality of selected memory cells 851 connected to a word line 831.

In some example embodiments, a control logic of the memory block 800 may be configured to perform the erase operation with respect to the plurality of selected memory cells 851 included in the word plane 860. The control logic may be configured to apply the first positive voltage $V_{on}$ to a plurality of string selection lines 810. The control logic may be configured to ground a bit line 820 connected to the plurality of selected memory cells 851 to the ground voltage GND and apply the negative voltage $V_{erase}$ having an absolute value that is greater than the absolute value of the first positive voltage $V_{on}$ to a selected word line 831 connected to the plurality of selected memory cells 851 among a plurality of word lines 831 and 832. The control logic may be configured to apply the first positive voltage $V_{on}$ to the word line 832 connected to the non-selected memory cell. Thus, the control logic may be configured to perform the erase operation with respect to the plurality of selected memory cells 851.

Figure 9:
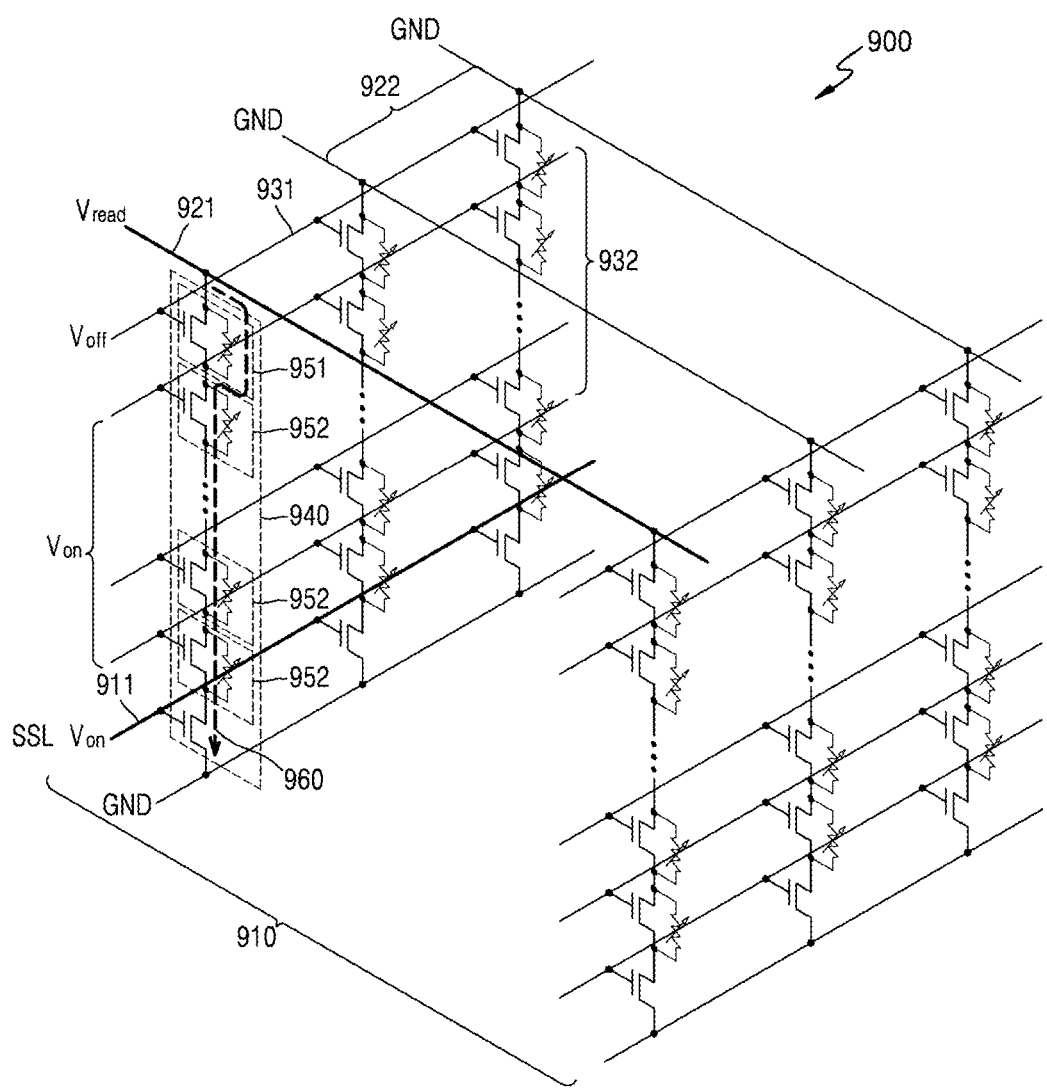
FIG. 9 illustrates a circuit corresponding to a memory block illustrated in FIG. 5 based on a read operation being performed, according to some example embodiments.

FIG. 9 illustrates a circuit corresponding to a memory block illustrated in FIG. 5 based on a read operation being performed, according to some example embodiments.

In FIG. 9 is illustrated a circuit corresponding a memory block 900 in the read operation. Referring to FIG. 9, a plurality of memory cells 951 and 952 included in a cell string 940 may be formed from the gate 531, the gate oxide layer 521, the resistance switching layer 522, and the semiconductor layer 523.

The cell string 940 of the memory block 900 may include the selected memory cell 951 and the non-selected memory cells 952. Hereinafter, the selected memory cell 951 may be subject to the read operation.

In some example embodiments, a control logic may be configured to perform the read operation with respect to the selected memory cell 951 included in the cell string 90. The control logic may be configured to apply a first positive voltage $V_{on}$ to a string selection line 911 connected to the selected memory cell 951, among a plurality of string selection lines 910. The control logic may be configured to apply a read voltage $V_{read}$ to a selected bit line 921 connected to the selected memory cell 951 among a plurality of bit lines 921 and 922, and apply a voltage $V_{off}$ having an absolute value less than an absolute value of the first positive voltage $V_{on}$ to a selected word line 931 connected to the selected memory cell 951 among a plurality of selected word lines 931 and 932. The control logic may be configured to apply the first positive voltage $V_{on}$ to the word line 932 connected to the non-selected memory cells 952. Thus, the control logic may be configured to perform the read operation with respect to the selected memory cell 951.

Referring to FIG. 5, a plurality of memory cells 951 and 952 included in a cell string 940 may be formed from the gate 531, the gate oxide layer 521, the resistance switching layer 522, and the semiconductor layer 523. The gate 531, the semiconductor layer 523, and the gate oxide layer 521 may form a transistor, and the resistance switching layer 522 may correspond to a resistor.

That is, each of the plurality of memory cells 951 and 952 may include a transistor and a resistor, and as the memory block 900 is structured as illustrated in FIG. 5, each of the plurality of memory cells 951 and 952 may correspond to a circuit in which a transistor and a resistor are connected in parallel.

The control logic may be configured to detect read current 960 by applying the voltage $V_{read}$ to the bit line 921 connected to the selected memory cell 951. In some example embodiments, the control logic may be configured to apply the voltage $V_{on}$ that is sufficient to turn on transistors included in the non-selected memory cell 952 to the word line 932 connected to the non-selected memory cell 952, thus turning on the transistors included in the non-selected memory cells 952 through 952. In this way, a channel may be formed in a semiconductor layer corresponding to the non-selected memory cell 952. In some example embodiments, the control logic 260 may cause the voltage $V_{off}$ to be applied to the selected memory cell 951 and to cause the transistor included in the selected memory cell 751 to be turned off. In this case, as the voltage $V_{read}$ is applied to the bit line 921 connected to the selected memory cell 951, the read current 960 may flow toward the resistor in the selected memory cell 951 and toward the transistor in the non-selected memory cell 952. Herein, the voltage $V_{off}$ has an absolute value less than that of the voltage $V_{on}$ and may be a positive voltage that is not sufficient to turn on the transistor included in the selected memory cell 751. For example, the voltage $V_{off}$ may be 0 or negative.

The control logic may be configured to read data based on the read current 960. For example, data may be, but not limited to, data regarding the number of memory cells for which the program (or erase) operation is performed among the plurality of memory cells 951 and 952 included in the cell string 940.

As described with reference to FIGS. 6 and 7, the resistance state of the selected memory cell 951 may be determined depending on positions of oxygen vacancies in the selected memory cell 951.

In the case that the program operation is performed with respect to the selected memory cell 951, the selected memory cell 951 may enter the low resistance state as oxygen vacancies in the selected memory cell 951 move toward the semiconductor layer 523. In the case that the erase operation is performed with respect to the selected memory cell 951, the selected memory cell 951 may enter the high resistance state as oxygen vacancies in the selected memory cell 951 move toward the semiconductor layer 523.

Based on the program operation being performed with respect to the selected memory cell 951, the selected memory cell 951 enters the low resistance state such that the control logic may be configured to detect a read current that is greater than a desired, preset, and/or selected value. Based on the erase operation being performed with respect to the selected memory cell 951, the selected memory cell 951 enters the high resistance state such that the control logic may be configured to detect read current lower than the desired, preset, and/or selected value. Herein, the desired, preset, and/or selected value may be a value of read current in an unprogrammed and unerased state of the selected memory cell 951.

That is, the value of the read current may vary with the number of memory cells on which the program (or erase) operation is performed among the plurality of memory cells 951 and 952 included in the cell string 940, and the control logic may be configured to read the data regarding the number of memory cells on which the program operation is performed, based on the read current.

Based on the read operation being performed with respect to the selected memory cell 951, the control logic may be configured to ground or float the other bit line 622. The control logic may be configured to prevent, reduce, and/or mitigate power loss caused by leakage current by grounding or floating the other bit line 622.

FIGS. 10A through 10D are views for describing movement of oxygen vacancies in a resistance switching layer in a program operation, an erase operation, and a read operation, according to some example embodiments.

Figure 10A:
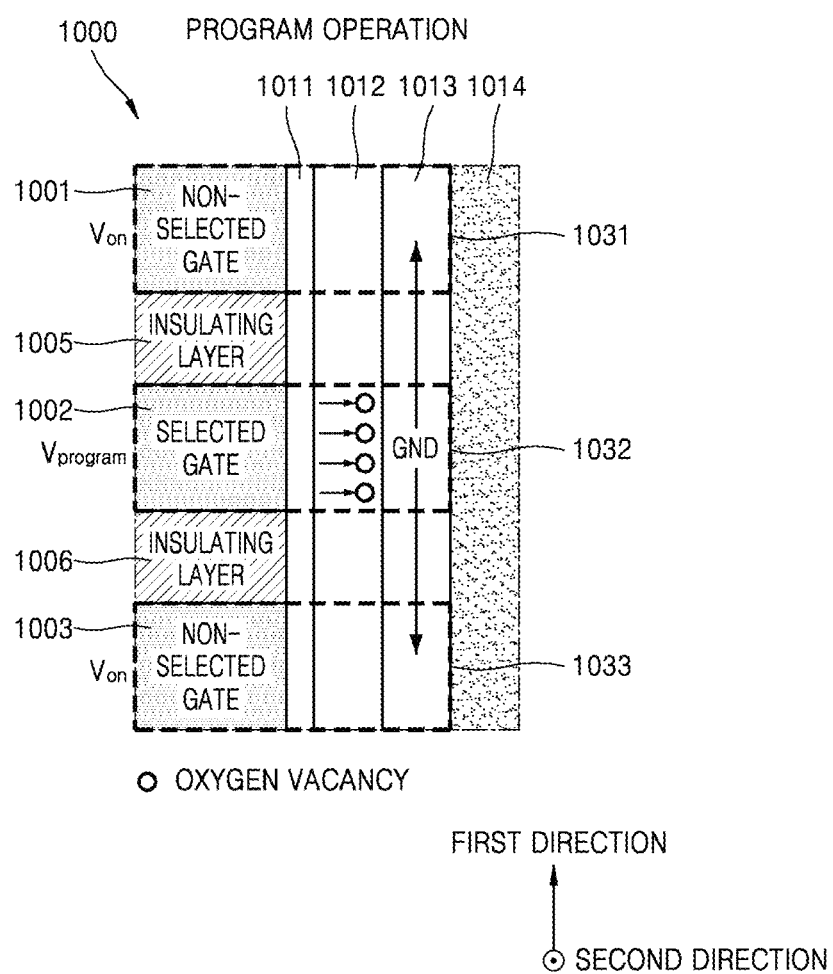
FIGS. 10A through 10D are views for describing movement of oxygen vacancies in a resistance switching layer in a program operation, an erase operation, and a read operation, according to some example embodiments.

In FIG. 10A is illustrated a memory block 1000. Gates 1001 through 1003, insulating layers 1005 and 1006, a gate oxide layer 1011, a resistance switching layer 1012, a semiconductor layer 1013, and an insulating layer 1014 may be arranged on a substrate (not shown) of the memory block 1000.

Referring to FIG. 10A, a gate oxide layer 1011, a resistance switching layer 1012, a semiconductor layer 1013, and an insulating layer 1014 may extend along a first direction. The gates 1001 through 1003 and the insulating layers 1005 and 1006 may intersect each other and extend along a second direction that is different than the first direction, for example, perpendicular to the first direction.

The gates 1001 through 1003, the semiconductor layer 1013, and the gate oxide layer 1011 may form a transistor, and the resistance switching layer 1012 may correspond to a resistor.

In the program operation, the control logic of the memory block 1000 may be configured to ground the semiconductor layer 1013 to the ground voltage GND, apply the voltage $V_{program}$ to a selected gate 1002 and the voltage $V_{on}$ to the non-selected gates 1001 and 1003. Thus, the control logic may be configured to perform the program operation with respect to the selected memory cell 1032 corresponding to the selected gate 1002. Herein, the voltages $V_{program}$ and $V_{on}$ both may be positive voltages, and the voltage $V_{program}$ may have a value that is greater than that of the voltage $V_{on}$.

More specifically, the control logic may be configured to apply a voltage sufficient to turn on the transistor and/or to apply the voltage $V_{program}$ to the selected gate 1002 and the voltage $V_{on}$ to the non-selected gates 1001 and 103. As the transistors corresponding to the selected gate 1002 and the non-selected gates 1001 and 1003 are turned on, the ground channel may be formed on the semiconductor layer 1013.

In a state where the ground channel is formed on the semiconductor layer 1013, the control logic 260 may be further configured to cause the voltage $V_{program}$ to be applied to the selected gate 1002 and the voltage $V_{on}$ to be applied to the non-selected gates 1001 and 1003, such that a voltage difference may occur between the plurality of gates 1001 through 1003 and the semiconductor layer 1013. In this case, the plurality of gates 1001 through 1003 may correspond to an upper electrode, the semiconductor layer 1013 may correspond to a lower electrode, and the resistance switching layer 1012 may correspond to a resistor between the upper electrode and the lower electrode.

Herein, the voltage $V_{on}$ applied to the non-selected gates 1001 and 1003 is a voltage suitable for turning on the transistors corresponding to the non-selected gates 1001 and 1003 that is not sufficient to move oxygen vacancies in the resistance switching layer 1012, and may be, for example, 2V through 3V. The voltage $V_{program}$ applied to the selected gate 1002 is a voltage suitable for turning on the transistor corresponding to the selected gate 1002 and for moving oxygen vacancies in the resistance switching layer 1012 toward the semiconductor layer 1013, and may be, for example, 5V through 6V.

In the example embodiments presented herein, the foregoing values of the voltages $V_{on}$ and $V_{program}$ are examples and may vary with a type of a material, a thickness, etc., of the gates 1001 through 1003, the insulating layers 1005 and 1006, the gate oxide layer 1011, the resistance switching layer 1012, and the semiconductor layer 1013.

In the case that the program operation is performed with respect to the selected gate 1002, the inside of the resistance switching layer 1012 corresponding to the selected gate 1002 may enter the low resistance state as the oxygen vacancies in the resistance switching layer 1012 corresponding to the selected gate 1002 move toward the semiconductor layer 1013.

Figure 10B:
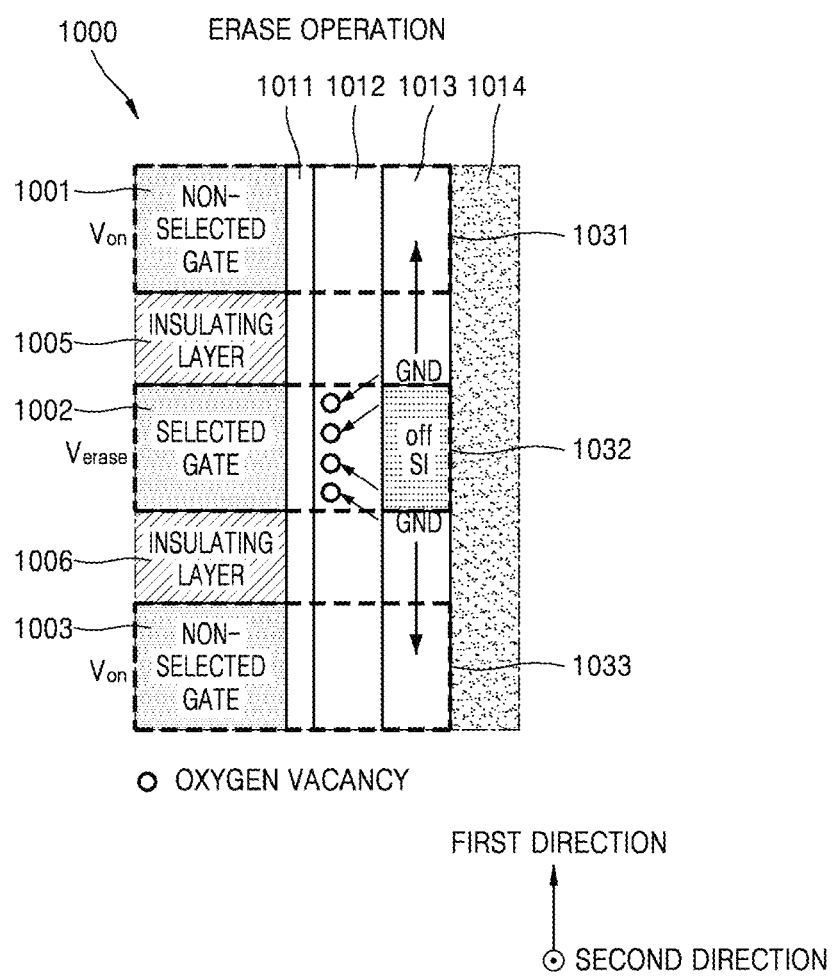

In FIG. 10B is illustrated the memory block 1000. In the following description, a description that overlaps that of FIG. 10A are not reproduced.

In the erase operation, the control logic of the memory block 1000 may be configured to ground the semiconductor layer 1013 to the ground voltage GND, apply the voltage $V_{erase}$ to a selected gate 1002 and the voltage $V_{on}$ to the non-selected gates 1001 and 1003. Thus, the control logic may be configured to perform the erase operation with respect to the selected memory cell 1032 corresponding to the selected gate 1002. Herein, the voltage $V_{erase}$ may be a negative voltage, the voltage $V_{on}$ may be a positive voltage, and the voltage $V_{erase}$ may have an absolute value that is greater than that of the voltage $V_{on}$.

More specifically, the control logic may be configured to apply a voltage sufficient to turn on the transistor and/or to apply the voltage $V_{on}$ to the non-selected gates 1001 and 103. In some example embodiments, the control logic 260 may cause the negative voltage $V_{erase}$ to be applied to the selected gate 1002, the transistor corresponding to the selected gate 1002 to be turned off, the transistors corresponding to the non-selected gates 1001 and 1003 to be turned off, and the voltage $V_{on}$ to be applied to the non-selected gates 1001 and 1003, such that the fringing field effect may occur and thus the ground channel may be formed on the semiconductor layer 1013.

In a state where the ground channel is formed on the semiconductor layer 1013, the control logic 260 may cause the voltage $V_{erase}$ to be applied to the selected gate 1002 and the voltage $V_{on}$ to be applied to the non-selected gates 1001 and 1003, and a voltage difference may occur between the plurality of gates 1001 through 1003 and the semiconductor layer 1013. In this case, the plurality of gates 1001 through 1003 may correspond to an upper electrode, the semiconductor layer 1013 may correspond to a lower electrode, and the resistance switching layer 1012 may correspond to a resistor between the upper electrode and the lower electrode.

Herein, the voltage $V_{on}$ applied to the non-selected gates 1001 and 1003 is a voltage suitable for turning on the transistors corresponding to the non-selected gates 1001 and 1003 and that is not sufficient to move oxygen vacancies in the resistance switching layer 1012, and may be, for example, 2V through 3V. The voltage $V_{erase}$ applied to the selected gate 1002 is a voltage suitable for moving oxygen vacancies in the resistance switching layer 1012 corresponding to the selected gate 1002 toward the semiconductor layer 1013, and may be, for example, −5V through −6V.

In the example embodiments presented herein, the foregoing values of the voltages $V_{on}$ and $V_{erase}$ are examples that may vary based on a type of a material, a thickness, etc., of the gates 1001 through 1003, the insulating layers 1005 and 1006, the gate oxide layer 1011, the resistance switching layer 1012, and the semiconductor layer 1013.

In the case that the erase operation is performed with respect to the selected gate 1002, the inside of the resistance switching layer 1012 corresponding to the selected gate 1002 may be configured to enter the high resistance state as the oxygen vacancies in the resistance switching layer 1012 corresponding to the selected gate 1002 move in the direction opposite to the semiconductor layer 1013.

Figure 10C:
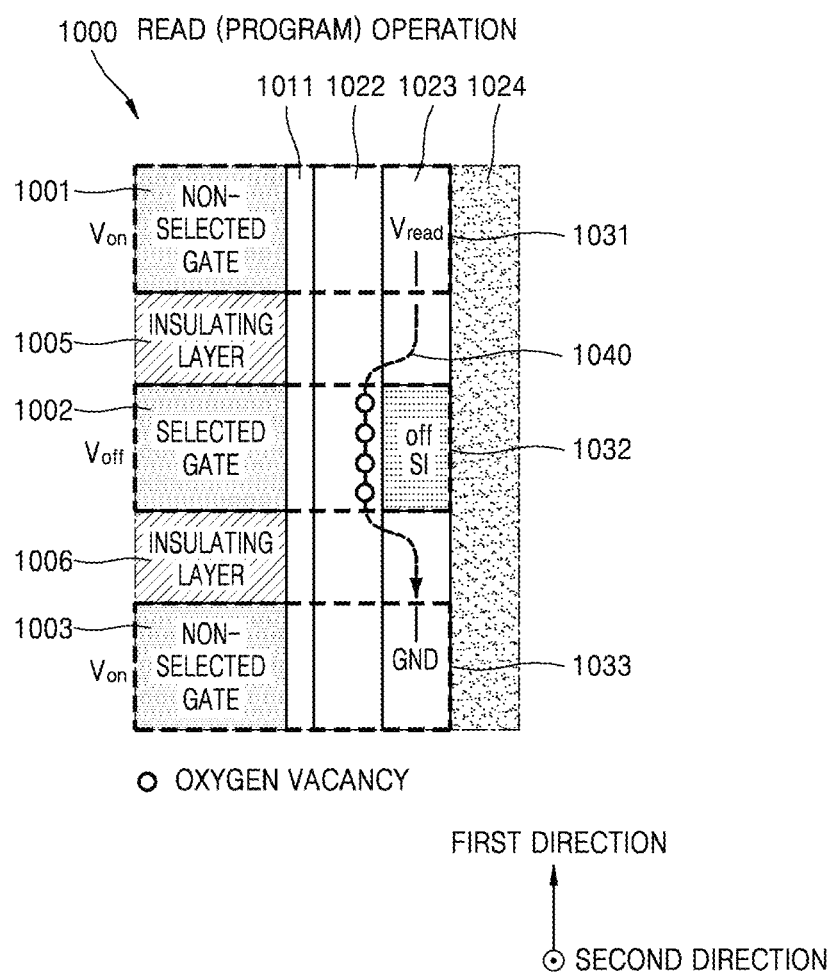

In FIG. 10C is illustrated the memory block 1000. In the following description, a description that overlaps that of FIGS. 10A and 10B are not reproduced.

In the read operation, the control logic of the memory block 1000 may be configured to apply the voltage $V_{read}$ to the semiconductor layer 1013, apply the voltage $V_{off}$ to the selected gate 1002, and apply and the voltage $V_{on}$ to the non-selected gates 1001 and 1003. Thus, the control logic may be configured to perform the read operation with respect to the selected memory cell 1032 corresponding to the selected gate 1002. Herein, the voltage $V_{off}$ may be a positive voltage, a negative voltage, or a voltage of 0, and an absolute value thereof may be less than that of the voltage $V_{on}$.

More specifically, the control logic may be configured to apply a voltage sufficient to turn on the transistor and may apply the voltage $V_{on}$ to the non-selected gates 1001 and 103. In this way, a channel may be formed in the semiconductor layer 1023 corresponding to the non-selected gates 1001 and 1003. In some example embodiments, the control logic 260 may cause the voltage $V_{off}$ to be applied to the selected gate 1002 and to cause the transistor corresponding to the selected gate 1002 to be turned off. In this case, as the voltage $V_{read}$ is applied to the semiconductor layer 1013, read current 1040 may flow toward a resistance switching layer 1022 in the selected gate 1002 and toward a transistor in the selected gate 1002.

In the case that the program operation is performed with respect to the selected memory cell 1032, the selected memory cell 1032 may be configured to enter the low resistance state as oxygen vacancies in the resistance switching layer 1012 corresponding to the selected gate 1002 are densely located around the semiconductor layer 1013. That is, based on the resistance switching layer 1012 corresponding to the selected gate 1002 entering the low resistance state, the control logic may be configured to detect a leakage current that is greater than a preset and/or selected value. Herein, the preset and/or selected value may be a value of the read current in an unprogrammed and also unerased state.

The control logic may be configured to read data based on the read current 1040. For example, data may be, but not limited to, data regarding the number of memory cells 1032 for which the program (or erase) operation is performed among a plurality of memory cells 1031 through 1033 corresponding to the plurality of gates 1001 through 1003.

In some example embodiments, a conductive property of a non-volatile memory device may differ according to the density of the oxygen vacancies in the resistance switching layer 1012 corresponding to the selected gate 1002 around the semiconductor layer 1013. For example, based on the density of the oxygen vacancies around the semiconductor layer 1013 being high, the selected memory cell 1032 may have the ohmic conductive property. Based on the density of the oxygen vacancies around the semiconductor layer 1013 being low, the selected memory cell 1032 may have a bulk conductive property like hopping, space-charge limited current (SCLC), Poole-Frenkel, etc.

Figure 10D:
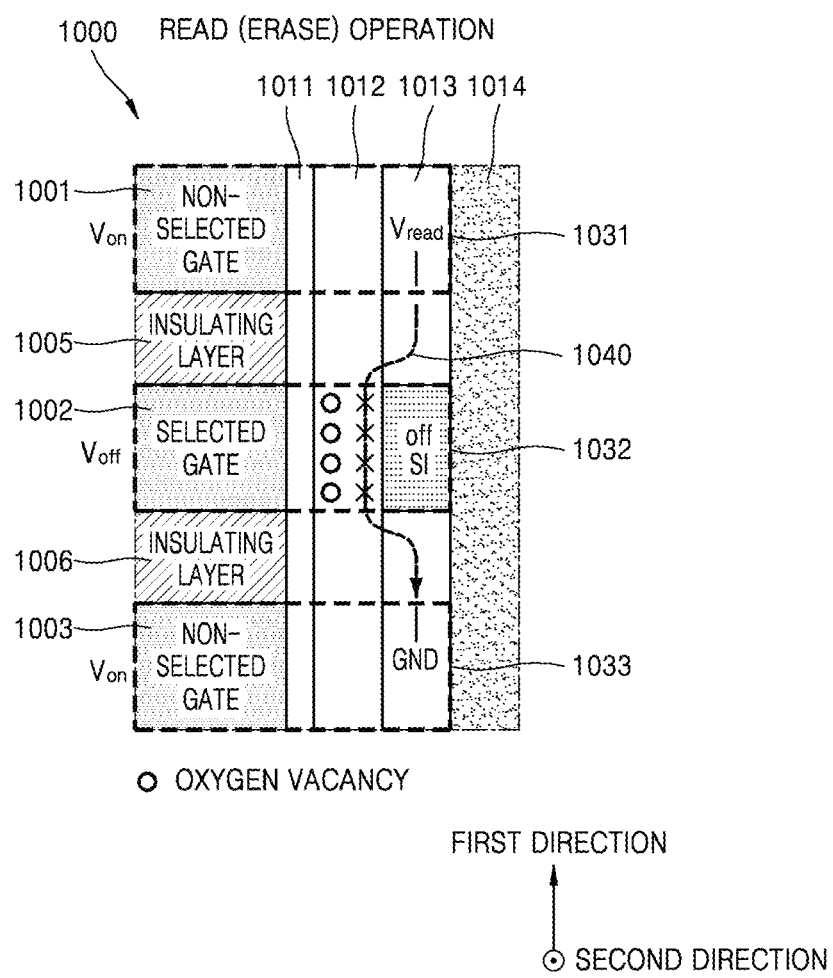

In FIG. 10D is illustrated the memory block 1000. In the following description, a description that overlaps that of FIGS. 10A and 10B are not reproduced.

In the read operation, the control logic of the memory block 1000 may be configured to apply the voltage $V_{read}$ to the semiconductor layer 1013, apply the voltage $V_{off}$ to the selected gate 1002, and apply and the voltage $V_{on}$ to the non-selected gates 1001 and 1003. Thus, the control logic may be configured to perform the read operation with respect to the selected memory cell 1032 corresponding to the selected gate 1002. Herein, the voltage $V_{off}$ may be a positive voltage, a negative voltage, or a voltage of 0, and an absolute value thereof may be less than that of the voltage $V_{on}$.

More specifically, the control logic may be configured to apply a voltage that is sufficient to turn on the transistor and/or to apply the voltage $V_{on}$ to the non-selected gates 1001 and 103. In this way, a channel may be formed in the semiconductor layer 1023 corresponding to the non-selected gates 1001 and 1003. In some example embodiments, the voltage $V_{off}$ may be applied to the selected gate 1002 such that the transistor corresponding to the selected gate 1002 may be turned off. In this case, as the voltage $V_{read}$ is applied to the semiconductor layer 1013, read current 1040 may flow toward a resistance switching layer 1022 in the selected gate 1002 and toward a transistor in the selected gate 1002.

In the case that the program operation is performed with respect to the selected memory cell 651, the selected memory cell 651 may enter the high resistance state as oxygen vacancies in the resistance switching layer 1012 corresponding to the selected gate 1002 are densely disposed around the gate oxide layer 1011. That is, based on the resistance switching layer 1012 corresponding to the selected gate 1002 entering the high resistance state, the control logic may be configured to detect a leakage current that is lower than a preset and/or selected value. Herein, the preset and/or selected value may be a value of the read current in an unprogrammed and also unerased state.

The control logic may be configured to read data based on the read current 1040. For example, data may be, but not limited to, data regarding the number of memory cells 1032 for which the program (or erase) operation is performed among a plurality of memory cells 1031 through 1033 corresponding to the plurality of gates 1001 through 1003.

FIGS. 11A through 11E are cross-sectional views sequentially showing a process of manufacturing a memory block according to some example embodiments.

Figure 11A:
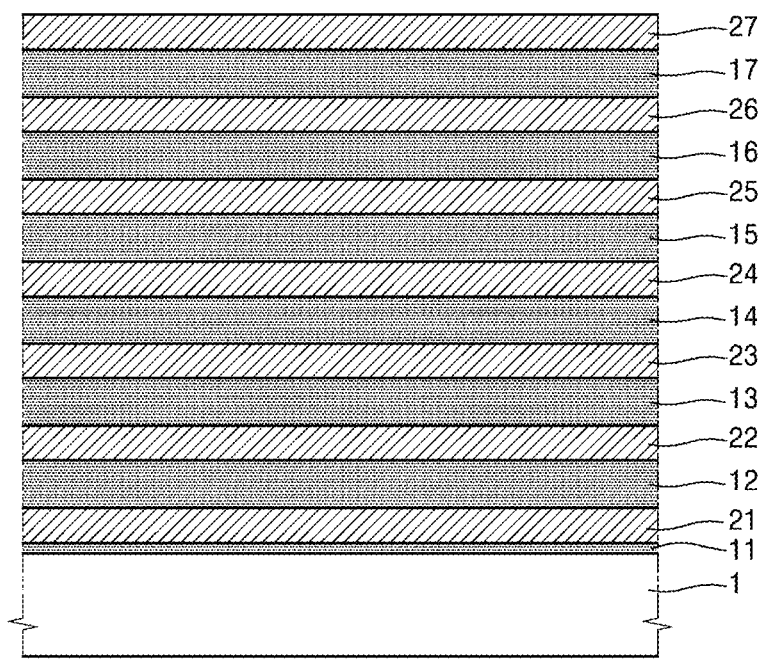
FIGS. 11A through 11E are cross-sectional views sequentially showing a process of manufacturing a memory block according to some example embodiments.

Referring to FIG. 11A, the substrate 1 is first provided. The substrate 1 may include a silicon material doped with a first-type impurity. For example, the substrate 1 may include a silicon material doped with a p-type impurity.

On the substrate 1, a plurality of gates 11 through 17 and a plurality of insulating layers 21 through 26 may be alternately stacked repeatedly to form a gate stack. For example, the plurality of gates 11 through 17 may include a metal material (e.g., copper, silver, etc.), and the plurality of insulating layers 21 through 26 may include, but not limited to, a silicon oxide or a silicon nitride.

Figure 11B:
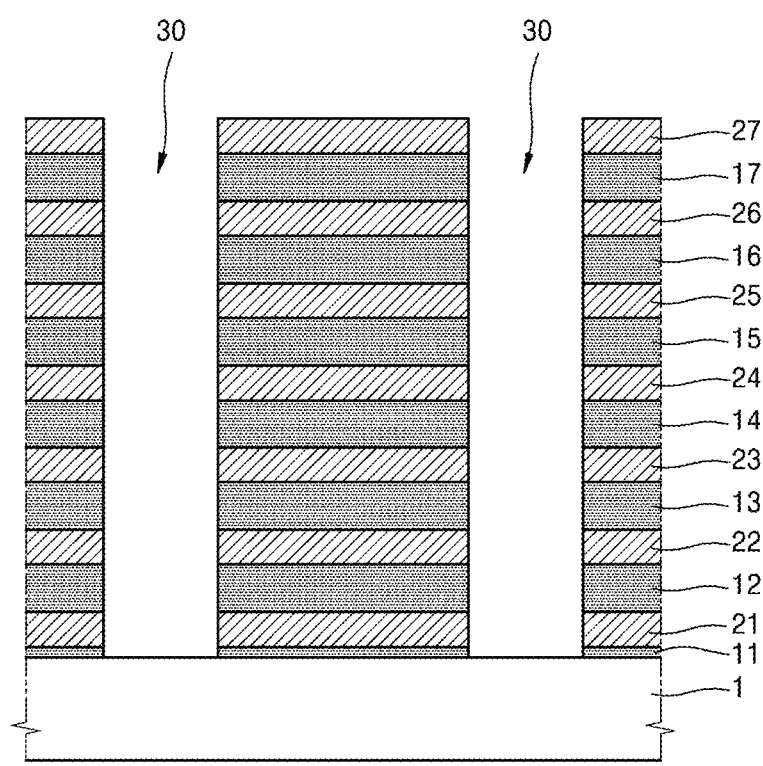

Referring to FIG. 11B, the gate stack including the plurality of gates 11 through 17 and the plurality of insulating layers 21 through 26 may be sequentially etched to form a pillar 30 that exposes the substrate 1.

Figure 11C:
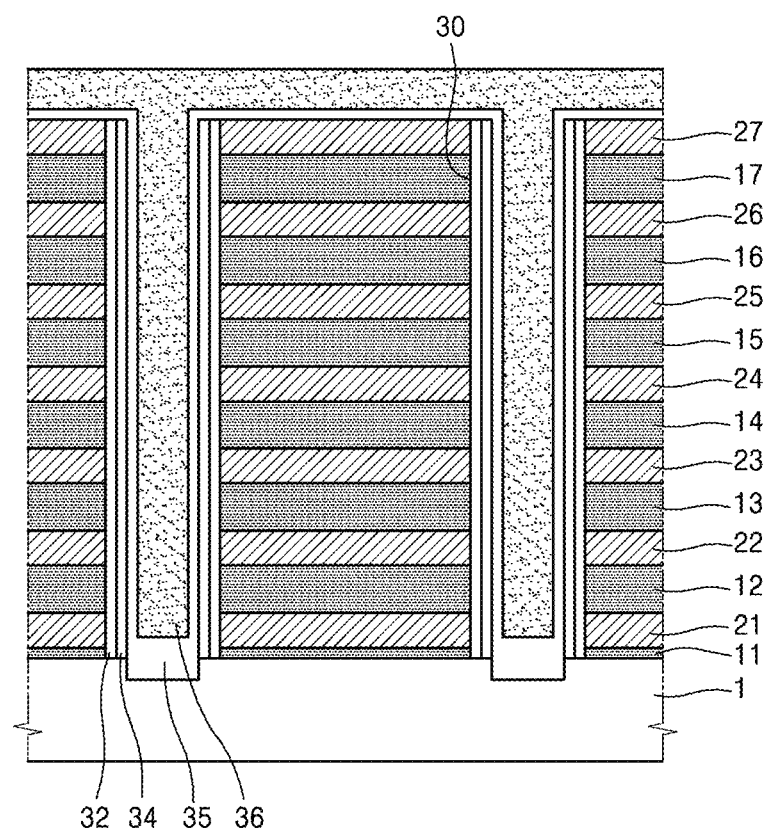

Referring to FIG. 11C, a gate oxide layer 32 may be conformally deposited on the substrate 1 where the pillar 30 is formed. For example, the gate oxide layer 32 may include a silicon oxide.

A resistance switching layer 34 may be conformally deposited on the gate oxide layer 32. In some example embodiments, the resistance switching layer 34 may be deposited on the gate oxide layer 32 by using atomic layer deposition (ALD) or chemical vapor deposition (CVD).

In some example embodiments, the resistance switching layer 34 may include a transition metal oxide or nitride. For example, the resistance switching layer 34 may include an oxide of at least one element selected from a group including zirconium (Zr), hafnium (Hf), aluminum (Al), nickel (Ni), copper (Cu), molybdenum (Mo), tantalum (Ta), titanium (Ti), tungsten (W), chrome (Cr), strontium (Sr), lanthanum (La), manganese (Mn), calcium (Ca), praseodymium (Pr), and silicon (Si). The resistance switching layer 34 may include a silicon nitride and an aluminum nitride.

A semiconductor layer 35 may be conformally deposited on the resistance switching layer 34. In some example embodiments, the semiconductor layer 35 may include a silicon material doped as a first type. The semiconductor layer 35 may include a silicon material doped as the same type as the substrate 1, and for example, if the substrate 1 includes a silicon material doped as a p type, the semiconductor layer 35 may also include a silicon material doped as a p type.

An insulating layer 36 may be filled in the semiconductor layer 35. For example, the insulating layer 36 may include a silicon oxide.

Figure 11D:
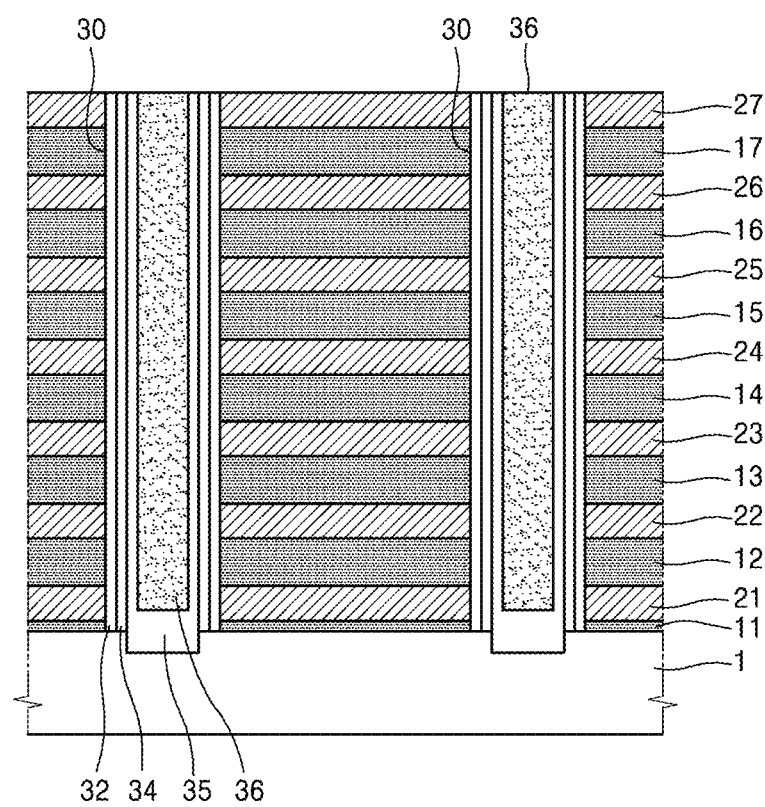

Referring to FIG. 11D, as a planarizing etching process is in progress, the gate oxide layer 32, the resistance switching layer 34, the semiconductor layer 35, and the insulating layer 36 on a seventh gate 17 are removed such that an upper surface of the seventh gate 17 may be exposed. Thus, the pillars 30 may be completed.

Figure 11E:
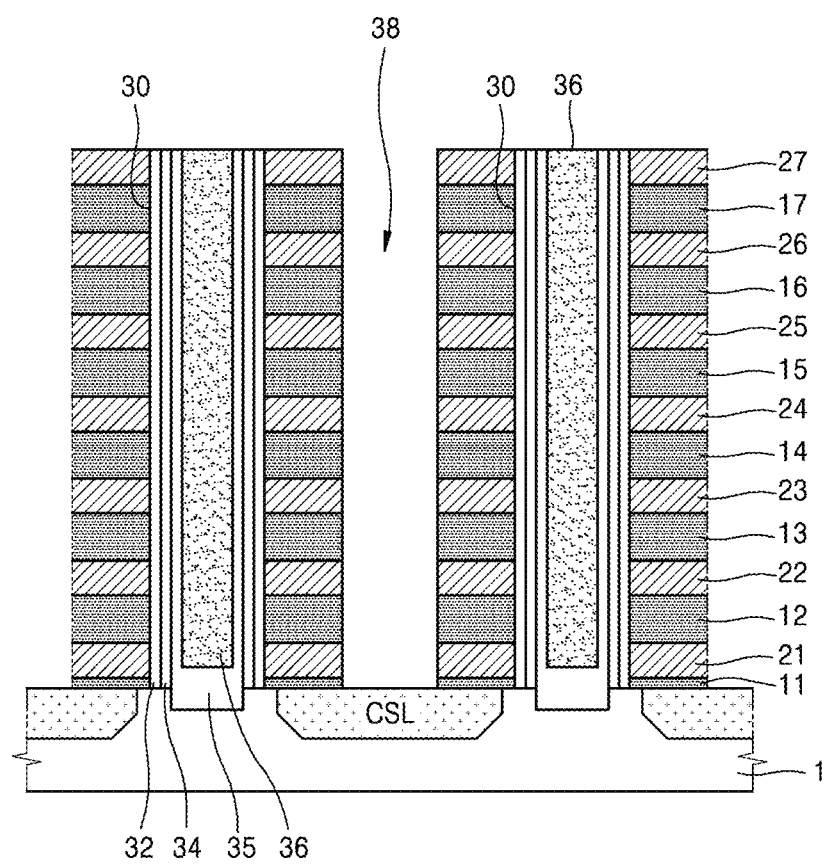

Referring to FIG. 11E, the plurality of gates 11 through 17 and the plurality of insulating layers 21 through 26 arranged between the pillars 30 forming the gate stack may be patterned such that a groove 38 that exposes the substrate 1 may be formed. In this case, by performing an ion injection process, a common source line CSL may be formed in the substrate 1 exposed through the groove 38.

The common source line CSL may be of a second type that is different from that of the substrate 1. For example, the common source line CSL may be of an n type.

According to some example embodiments of the present disclosure, by using the resistance switching layer 522 instead of a phase change material, generation of heat or stress (pressure) in a memory block due to the use of the phase change material may be prevented, reduced, and/or mitigated. Reducing the generation of heat or stress in a memory block may provide performance improvements. As a first example, because temperature changes may alter some characteristics of a transistor such as an amount of conducted current, reducing temperature variation by using a resistance switching layer 522 may reduce variation in such characteristics of the transistor. As a second example, reducing the generation of heat or stress in a memory block may promote the continued operation of the memory cell over a longer time span. Alternatively or additionally, according to some example embodiments of the present disclosure, by making and operating the memory block as described above, an ion movement between adjacent memory cells and a resultant leakage current or operation failure may be prevented, reduced, and/or mitigated based on the memory cells included in the memory block operating repeatedly. A reduction of leakage current may reduce a variance of the operating characteristics of other components of a non-volatile memory device through which the leakage current may have flowed and/or may conserve the consumption of power, which may in turn extend the operating duration of a battery-powered device. Furthermore, the memory block according to the present disclosure may address a scaling issue between memory cells in next-generation VNAND, thereby increasing density thereof, which may increase a storage capacity of a non-volatile memory device and/or may enable a similar amount of data to be stored by a smaller non-volatile memory device.

Those of ordinary skill in the art to which the disclosure pertains will appreciate that the disclosure may be implemented in different detailed ways without departing from the scope of the disclosure. Accordingly, the aforementioned embodiments should be construed as being only illustrative, but should not be constructed as being restrictive from all aspects. For example, each element described as a single type may be implemented in a distributed manner, and likewise, elements described as being distributed may be implemented as a coupled type. As another example, events that are described as occurring simultaneously or concurrently may be equivalently performed in sequence, and vice versa, and/or partly simultaneously and partly sequentially, without departing from the scope of the present disclosure. As another example, some example embodiments may describe events in a chronological manner, such as an event occurring "while" a condition is true, or a first event occurring "as" a second event occurs. However, some other example embodiment may exhibit such events and/or conditions in a different manner, such as with a causal and/or related, though not necessarily chronological, relationship, without departing from the scope of the present disclosure.

A scope of some example embodiments is defined by the following claims rather than the detailed description, and the meanings and scope of the claims and all changes or modified forms derived from their equivalents should be construed as falling within the scope of the disclosure.

It should be understood that example embodiments described herein should be considered in a descriptive sense only and not for purposes of limitation. Descriptions of features or aspects within each embodiment should be considered as available for other similar features or aspects in other example embodiments. For example, while one or more example embodiments have been described with reference to the figures, it will be understood by those of ordinary skill in the art that various changes in form and details may be made therein without departing from the scope of the disclosure.

What is claimed is:

1. A non-volatile memory device comprising:
 a control logic;
 a semiconductor layer extending in a first direction;
 a gate stack including a plurality of gates and a plurality of insulating layers, both extending in a second direction different than the first direction, and the plurality of gates and the plurality of insulating layers being stacked alternately with each other;
 a resistance switching layer extending in the first direction between the gate stack and the semiconductor layer; and a gate oxide layer extending in the first direction between the gate stack and the resistance switching layer, wherein a cell string is formed by the gate stack, the resistance switching layer, and the gate oxide layer.

2. The non-volatile memory device of claim 1, wherein the cell string comprises a selected memory cell and a non-selected memory cell, and the control logic is configured to perform a program operation with respect to the selected memory cell by, applying a first positive voltage to a string selection line connected to the selected memory cell, grounding a bit line connected to the selected memory cell, applying a second positive voltage that is greater than the first positive voltage to a word line connected to the selected memory cell, and applying the first positive voltage to a word line connected to the non-selected memory cell.

3. The non-volatile memory device of claim 1, wherein the cell string comprises a selected memory cell and a non-selected memory cell, and the control logic is configured to perform an erase operation with respect to the selected memory cell by, applying a first positive voltage to a string selection line connected to the selected memory cell, ground a bit line connected to the selected memory cell, applying a negative voltage having an absolute value that is greater than an absolute value of the first positive voltage to a word line connected to the selected memory cell, and applying the first positive voltage to a word line connected to the non-selected memory cell.

4. The non-volatile memory device of claim 2, wherein the control logic is further configured to, based on the bit line connected to the selected memory cell being grounded, cause the first positive voltage to be applied to the word line connected to the non-selected memory cell, and cause the second positive voltage to be applied to the word line connected to the selected memory cell, a ground channel is formed in the semiconductor layer, and the selected memory cell is configured such that, based on a voltage difference between a gate corresponding to the selected memory cell and the ground channel based on the second positive voltage to the word line connected to the selected memory cell, oxygen vacancies in the selected memory cell move towards the semiconductor layer such that the program operation with respect to the selected memory cell is performed.

5. The non-volatile memory device of claim 3, wherein the control logic is further configured to, based on the bit line connected to the selected memory cell being grounded, cause the first positive voltage to be applied to the word line connected to the non-selected memory cell, and cause the negative voltage to be applied to the word line connected to the selected memory cell to form a ground channel in the semiconductor layer due to a fringing field effect caused by the non-selected memory cell that is adjacent to the selected memory cell, and the memory cell is configured such that, based on a voltage difference between a gate corresponding to the selected memory cell and the ground channel and the negative voltage to the word line connected to the selected memory cell, oxygen vacancies in the selected memory cell move in a direction opposite to the semiconductor layer such that the erase operation with respect to the selected memory cell is performed.

6. The non-volatile memory device of claim 1, wherein the cell string includes a selected memory cell and a non-selected memory cell, and the control logic is configured to perform a read operation with respect to the selected memory cell by, applying a first positive voltage to a string selection line connected to the selected memory cell, applying a read voltage to a bit line connected to the selected memory cell, applying a voltage having an absolute value that is less than an absolute value of the first positive voltage to a word line connected to the selected memory cell, and applying the first positive voltage to a word line connected to the non-selected memory cell.

7. The non-volatile memory device of claim 6, wherein the memory cell is further configured such that a resistance state of the selected memory cell is based on positions of oxygen vacancies in the selected memory cell, and the control logic is further configured to apply the read voltage to the bit line connected to the selected memory cell and read data based on a read current that is determined by the resistance state of the selected memory cell.

8. The non-volatile memory device of claim 7, wherein the selected memory cell is configured to enter a low resistance state as the oxygen vacancies in the selected memory cell move towards the semiconductor layer based on a program operation being performed with respect to the selected memory cell, and the selected memory cell is configured to enter a high resistance state as the oxygen vacancies in the selected memory cell move in a direction opposite to the semiconductor layer based on an erase operation being performed with respect to the selected memory cell.

9. The non-volatile memory device of claim 1, wherein a word plane comprises a plurality of selected memory cells that are connected to a word line, and the control logic is further configured to perform an erase operation with respect to the plurality of selected memory cells by, applying a first positive voltage to a plurality of string selection lines connected to the plurality of selected memory cell, grounding a bit line connected to the plurality of selected memory cells, applying a negative voltage having an absolute value that is greater than an absolute value of the first positive voltage to the word line, and applying the first positive voltage to a word line other than the word line.

10. The non-volatile memory device of claim 1, wherein the gate, the semiconductor, and the gate oxide layer form a transistor, and the control logic is further configured to perform a read operation by causing a memory cell included in the cell string corresponding to a circuit in which the transistor and a resistor corresponding to the resistance switching layer to be connected in parallel.

11. The non-volatile memory device of claim 10, wherein the cell string comprises a selected memory cell and a non-selected memory cell, and the control logic is further configured to, based on the control logic performing the read operation, cause a transistor corresponding to the selected memory cell to be turned off based on a voltage of a word line connected to the selected memory cell, and cause a transistor corresponding to the non-selected memory cell to be turned on based on a second positive voltage having an absolute value that is greater than an absolute value of the voltage of the word line connected to the non-selected memory cell.

12. The non-volatile memory device of claim 10, wherein the cell string comprises a plurality of memory cells, and the control logic is further configured to perform a program operation or an erase operation by, causing a bit line connected to the plurality of memory cells to be grounded, causing the transistor to be turned on based on a positive voltage to a word line connected to the plurality of memory cells so that the ground channel is formed in the semiconductor layer, and causing the plurality of memory cells corresponding to a circuit in which a resistor corresponding to the resistance switching layer and the ground channel to be connected in series.

13. The non-volatile memory device of claim 2, wherein the control logic is further configured to apply a positive voltage that is less than the second positive voltage to a bit line other than the bit line connected to the selected memory cell.

14. The non-volatile memory device of claim 3, wherein the control logic is further configured to apply a negative voltage that is less than the negative voltage to a bit line other than the bit line connected to the selected memory cell.

15. The non-volatile memory device of claim 6, wherein the control logic is further configured to ground or float a bit line other than the bit line connected to the selected memory cell.

16. The non-volatile memory device of claim 8, wherein a resistance of the selected memory cell in the low resistance state is greater than a resistance of a ground channel formed in the semiconductor layer.

17. The non-volatile memory device of claim 1, wherein the resistance switching layer comprises a transition metal oxide or nitride.

18. The non-volatile memory device of claim 8, wherein the selected memory cell has an ohmic conductive property in the low resistance state.

19. A method of manufacturing a non-volatile memory device, the method comprising:

providing a substrate;

forming a gate stack by alternately stacking a plurality of gates and a plurality of insulating layers on the substrate in a repeated manner;

forming a pillar that exposes the substrate, by etching the gate stack;

conformally depositing a gate oxide layer on the pillar;

conformally depositing a resistance switching layer on the gate oxide layer;

conformally depositing a semiconductor layer on the resistance switching layer; and filling an insulator in the semiconductor layer, wherein the resistance switching layer extends in a first direction between the gate stack and the semiconductor layer, and the gate oxide layer extending in the first direction between the gate stack and the resistance switching layer, and wherein a cell string is formed by the gate stack, the resistance switching layer, and the gate oxide layer.

20. The method of claim 19, wherein the resistance switching layer is deposited on the gate oxide layer by using atomic layer deposition (ALD) or chemical vapor deposition (CVD).

* * * * *